US010249728B2

(12) United States Patent
Chanemougame et al.

(10) Patent No.: US 10,249,728 B2
(45) Date of Patent: Apr. 2, 2019

(54) AIR-GAP GATE SIDEWALL SPACER AND METHOD

(71) Applicant: GLOBALFOUNDRIES INC., Grand Cayman (KY)

(72) Inventors: Daniel Chanemougame, Niskayuna, NY (US); Andre Labonte, Mechanicville, NY (US); Ruilong Xie, Schenectady, NY (US); Lars Liebmann, Mechanicville, NY (US); Nigel Cave, Saratoga Springs, NY (US); Guillaume Bouche, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/955,989

(22) Filed: Apr. 18, 2018

(65) Prior Publication Data

US 2018/0240883 A1    Aug. 23, 2018

Related U.S. Application Data

(62) Division of application No. 15/408,540, filed on Jan. 18, 2017, now Pat. No. 10,026,824.

(51) Int. Cl.
*H01L 29/49* (2006.01)
*H01L 23/535* (2006.01)
(Continued)

(52) U.S. Cl.
CPC ...... *H01L 29/4991* (2013.01); *H01L 21/0217* (2013.01); *H01L 21/28141* (2013.01);
(Continued)

(58) Field of Classification Search
CPC ......... H01L 29/4991; H01L 21/823468; H01L 29/66545; H01L 29/66795; H01L 29/785;
(Continued)

(56) References Cited

U.S. PATENT DOCUMENTS 6,787,469 B2    9/2004  Houston et al.
7,741,663 B2    6/2010  Hause et al.
(Continued)

OTHER PUBLICATIONS

Daniel Benoit et al., "Interest of SiCO Low K=4.5 Spacer Deposited At Low Temperature (4000° C.) in the Perspective of 3D VLSI Integration", IEEE Conference Paper, Dec. 2015, pp. 201-204.
(Continued)

*Primary Examiner* — Bac Au
(74) *Attorney, Agent, or Firm* — Gibb & Riley, LLC; Francois Pagette

(57) ABSTRACT

Disclosed are integrated circuit (IC) structures and formation methods. In the methods, a gate with a sacrificial gate cap and a sacrificial gate sidewall spacer is formed on a channel region. The cap and sidewall spacer are removed, creating a cavity with a lower portion between the sidewalls of the gate and adjacent metal plugs and with an upper portion above the lower portion and the gate. A first dielectric layer is deposited, forming an air-gap in the lower portion and lining the upper portion. A second dielectric layer is deposited, filling the upper portion. During formation of a gate contact opening (optionally over an active region), the second dielectric layer is removed and the first dielectric layer is anisotropically etched, thereby exposing the gate and creating a dielectric spacer with a lower air-gap segment and an upper solid segment. Metal deposited into the opening forms the gate contact.

18 Claims, 24 Drawing Sheets

(51) Int. Cl.
*H01L 29/66* (2006.01)
*H01L 21/768* (2006.01)
*H01L 29/06* (2006.01)
*H01L 21/306* (2006.01)
*H01L 21/84* (2006.01)
*H01L 21/28* (2006.01)
*H01L 27/12* (2006.01)
*H01L 27/092* (2006.01)
*H01L 27/088* (2006.01)
*H01L 29/78* (2006.01)
*H01L 29/417* (2006.01)
*H01L 21/02* (2006.01)
*H01L 29/40* (2006.01)
*H01L 21/764* (2006.01)
*H01L 21/8238* (2006.01)
*H01L 27/108* (2006.01)
*H01L 21/8234* (2006.01)

(52) U.S. Cl.
CPC ...... *H01L 21/30604* (2013.01); *H01L 21/764* (2013.01); *H01L 21/7682* (2013.01); *H01L 21/76805* (2013.01); *H01L 21/76895* (2013.01); *H01L 21/845* (2013.01); *H01L 23/535* (2013.01); *H01L 27/0886* (2013.01); *H01L 27/0924* (2013.01); *H01L 27/1211* (2013.01); *H01L 29/0649* (2013.01); *H01L 29/401* (2013.01); *H01L 29/41791* (2013.01); *H01L 29/6653* (2013.01); *H01L 29/6656* (2013.01); *H01L 29/6681* (2013.01); *H01L 29/66545* (2013.01); *H01L 29/66795* (2013.01); *H01L 29/785* (2013.01); *H01L 21/823431* (2013.01); *H01L 21/823468* (2013.01); *H01L 21/823821* (2013.01); *H01L 27/10826* (2013.01); *H01L 27/10844* (2013.01); *H01L 29/66636* (2013.01); *H01L 29/66689* (2013.01); *H01L 29/66719* (2013.01); *H01L 2924/13067* (2013.01)

(58) Field of Classification Search
CPC ............ H01L 29/6653; H01L 29/6656; H01L 29/0649; H01L 21/823431; H01L 27/0886; H01L 27/0924; H01L 21/30604; H01L 29/41791; H01L 29/401; H01L 21/845; H01L 21/823821; H01L 21/0217; H01L 29/6681; H01L 21/764; H01L 21/7682; H01L 29/66636; H01L 21/28141; H01L 27/10826; H01L 27/10844; H01L 2924/13067; H01L 29/666

See application file for complete search history.

(56) References Cited

U.S. PATENT DOCUMENTS

| | | | |
|---|---|---|---|
| 8,962,472 B2 * | 2/2015 | Rho | H01L 29/92 438/626 |
| 9,252,233 B2 | 2/2016 | Hsiao et al. | |
| 9,362,355 B1 * | 6/2016 | Cheng | H01L 29/66742 |
| 9,368,572 B1 | 6/2016 | Cheng et al. | |
| 9,412,659 B1 * | 8/2016 | Zang | H01L 29/4991 |
| 9,472,644 B2 * | 10/2016 | Sung | H01L 29/6656 |
| 9,536,982 B1 | 1/2017 | Cheng et al. | |
| 9,608,065 B1 * | 3/2017 | Bergendahl | H01L 27/0886 |
| 9,786,760 B1 * | 10/2017 | Bonilla | H01L 29/4991 |
| 2009/0065814 A1 | 3/2009 | Bhalla et al. | |
| 2009/0065855 A1 | 3/2009 | Bhalla et al. | |
| 2009/0065861 A1 | 3/2009 | Bhalla et al. | |
| 2012/0104512 A1 * | 5/2012 | Horak | H01L 29/4983 257/401 |
| 2012/0199886 A1 * | 8/2012 | Horak | H01L 21/76897 257/288 |
| 2013/0049132 A1 | 2/2013 | Doris et al. | |
| 2013/0034587 A1 | 12/2013 | Purayath et al. | |
| 2014/0077305 A1 | 3/2014 | Pethe et al. | |
| 2014/0138779 A1 * | 5/2014 | Xie | H01L 29/66545 257/401 |
| 2015/0214113 A1 | 7/2015 | Bouche et al. | |
| 2015/0243544 A1 | 8/2015 | Alptekin et al. | |
| 2016/0111515 A1 | 4/2016 | Besser et al. | |
| 2016/0365426 A1 | 12/2016 | Ching et al. | |
| 2017/0125530 A1 * | 5/2017 | Zhang | H01L 29/41791 |
| 2017/0194423 A1 * | 7/2017 | Lin | G02B 26/101 |
| 2018/0097059 A1 * | 4/2018 | Bi | H01L 29/0649 |

OTHER PUBLICATIONS

U.S. Appl. No. 15/408,540, Restriction Requirement dated Jan. 9, 2018, pp. 1-7.
U.S. Appl. No. 15/408,540, Office Action Communication dated Jan. 30, 2018, pp. 1-11.
U.S. Appl. No. 15/408,540, Notice of Allowance dated Mar. 27, 2018, pp. 1-5.

* cited by examiner

AIR-GAP GATE SIDEWALL SPACER AND METHOD

CROSS-REFERENCE TO RELATED APPLICATIONS

The present invention claims the benefit under 35 U.S.C. § 120 as a divisional of U.S. patent application Ser. No. 15/408,540 filed on Jan. 18, 2017, now issued as U.S. Pat. No. 10,026,724 on Jul. 17, 2018, the entire teachings of which are incorporated herein by reference.

FIELD OF THE INVENTION

The present invention relates to integrated circuit (IC) structures and, more particularly, to methods of forming IC structures with one or more transistors having an air-gap gate sidewall spacer and, optionally, a gate contact (CB) over an active region (CBoA) or close thereto.

BACKGROUND

Recently, methods of forming integrated circuit (IC) structures have been developed that enable the formation of a field effect transistor (FET) with an air-gap gate sidewall spacer. With such an air-gap gate sidewall spacer, parasitic capacitance (e.g., the capacitance between the FET gate and the metal plugs on the FET source/drain regions) is reduced as compared to a FET with a conventional gate sidewall spacer. Additionally, methods of forming integrated circuit (IC) structures have been developed that enable the formation of a FET with a gate contact over an active region (CBoA) to allow for area scaling. More specifically, middle of the line (MOL) contacts are contacts that connect field effect transistors (FETs) to the back end of the line (BEOL) metal levels. These MOL contacts include at least one gate contact (CB) and source/drain contacts (CAs). The gate contact extends vertically through the interlayer dielectric (ILD) material from a metal wire or via in the first BEOL metal level (referred to herein as the $M_0$ level) to the gate of the FET. Each source/drain contact extends vertically through the ILD material from a metal wire or via in the first BEOL metal level to a metal plug (TS), which is above and immediately adjacent to a source/drain region of the FET. Conventional techniques for forming these MOL contacts inherently include risks of the following: (a) shorts occurring between the gate contact and a metal plug, particularly, if the gate contact is over an active region or close thereto; and (b) shorts occurring between the source/drain contacts and the gate. However, new techniques have been developed that provide for the formation of these MOL contacts without incurring the above-mentioned risks of shorts. Unfortunately, the techniques used to form a FET with an air-gap gate sidewall spacer are currently incompatible with the techniques used to form a FET with a gate contact over an active region (CBoA).

SUMMARY

In view of the foregoing, disclosed herein are methods of forming an integrated circuit (IC) structure having one or more transistors, each with an air-gap gate sidewall spacer and, optionally, a gate contact over an active region (i.e., a CBoA) or close thereto.

Generally, each of the methods can include forming at least one transistor. During formation of the transistor, a gate can be formed adjacent to a semiconductor body at a channel region, wherein the channel region is positioned laterally between source/drain regions and the gate has a sacrificial gate cap and a sacrificial gate sidewall spacer. Metal plugs with plug caps can be formed on the source/drain regions so as to be positioned laterally immediately adjacent to the sacrificial gate sidewall spacer. Subsequently, the sacrificial gate cap and the sacrificial gate sidewall spacer can be selectively etched away from the gate to create a cavity around the gate. This cavity can have a lower portion and an upper portion, wherein the lower portion exposes sidewalls of the gate and the metal plugs on opposing sides of the gate and wherein the upper portion is above the lower portion and the gate.

After the cavity is formed around the gate, a first dielectric layer can be deposited into the cavity in such a way as to create an air-gap in the lower portion of the cavity and to line the upper portion of the cavity. A second dielectric layer can be deposited on the first dielectric layer, filling the upper portion of the cavity. During subsequent formation of a gate contact opening for a gate contact, the second dielectric layer can be removed and the first dielectric layer can be anisotropically etched, thereby creating a dielectric spacer with a lower air-gap segment and an upper solid segment. Due to different dielectric materials used for the plug caps over the metal plugs, for the first dielectric layer and for the second dielectric layer, this gate contact opening will be self-aligned to the gate. Thus, the gate contact can be formed over an active region (or close thereto) without risk of shorting to an adjacent metal plug.

One particular method embodiment disclosed herein forms an integrated circuit (IC) structure having multiple FETs, each with an air-gap gate sidewall spacer and, optionally, a gate contact over an active region (i.e., a CBoA) or close thereto.

In this method embodiment, multiple transistors can be formed. During formation of the transistors, gates can be formed adjacent to a semiconductor body at channel regions, wherein each channel region is positioned laterally between source/drain regions. Each gate can specifically be formed so as to have a sacrificial gate cap and a sacrificial gate sidewall spacer. Additionally, metal plugs can be formed on the source/drain regions such that each metal plug is positioned laterally immediately adjacent to at least one sacrificial gate sidewall spacer. The metal plugs can be etched back to form recesses above the metal plugs and plug caps can be formed within the recesses. Subsequently, the sacrificial gate cap and the sacrificial gate sidewall spacer can be selectively etched away from each of the gates to create cavities around the gates. Each cavity around each gate can have a lower portion and an upper portion, wherein the lower portion exposes sidewalls of the gate and adjacent metal plugs on opposing sides of the gate and wherein the upper portion is above the lower portion and the gate.

After the cavities are formed around the gates, a first dielectric layer can be deposited into the cavities such that, in each cavity, an air-gap is created in the lower portion of the cavity and the first dielectric layer lines the upper portion of the cavity. A second dielectric layer can be deposited into the cavities on the first dielectric layer, thereby filling the upper portion of each cavity. The first dielectric layer and the second dielectric layer can then be removed (from above the plug caps (e.g., by performing a chemical mechanical polishing (CMP) process) and an interlayer dielectric layer can be formed above and immediately adjacent to the plug caps and further extending laterally over the first and second dielectric layers within the cavities.

Contacts can be formed through the interlayer dielectric layer to at least one gate and at least one metal plug. During formation of a gate contact opening, the second dielectric layer can be removed and the first dielectric layer can be anisotropically etched, thereby creating a dielectric spacer with a lower air-gap segment and an upper solid segment. Due to different dielectric materials used for the plug caps, for the first dielectric layer and for the second dielectric layer, this gate contact opening will be self-aligned to the gate. Thus, the gate contact can be formed over an active region (or close thereto) without risk of shorting to an adjacent metal plug.

Also disclosed herein are integrated circuit (IC) structures formed according to the above-described methods so as to have one or more transistors, each with an air-gap gate sidewall spacer and, optionally, a gate contact over an active region (i.e., a CBoA) or close thereto. Each IC structure can incorporate at least one transistor. Each transistor can have a gate adjacent to a semiconductor body at a channel region. The channel region can be positioned laterally between source/drain regions. A gate contact can be above and immediately adjacent to the gate. Metal plugs can be on the source/drain regions and plug caps can be above and immediately adjacent to the metal plugs. Each transistor can further have a dielectric spacer, which has a lower air-gap segment and an upper solid segment. The lower air-gap segment can be positioned laterally between the gate and the metal plugs and the upper solid segment can be above the lower air-gap segment and positioned laterally between the gate contact and the plug caps. Optionally, the dielectric spacer can have an additional segment between the semiconductor body and the lower air-gap segment. The upper solid segment of the dielectric spacer, the optional additional segment of the dielectric spacer and the plug caps can be made of three different dielectric materials.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
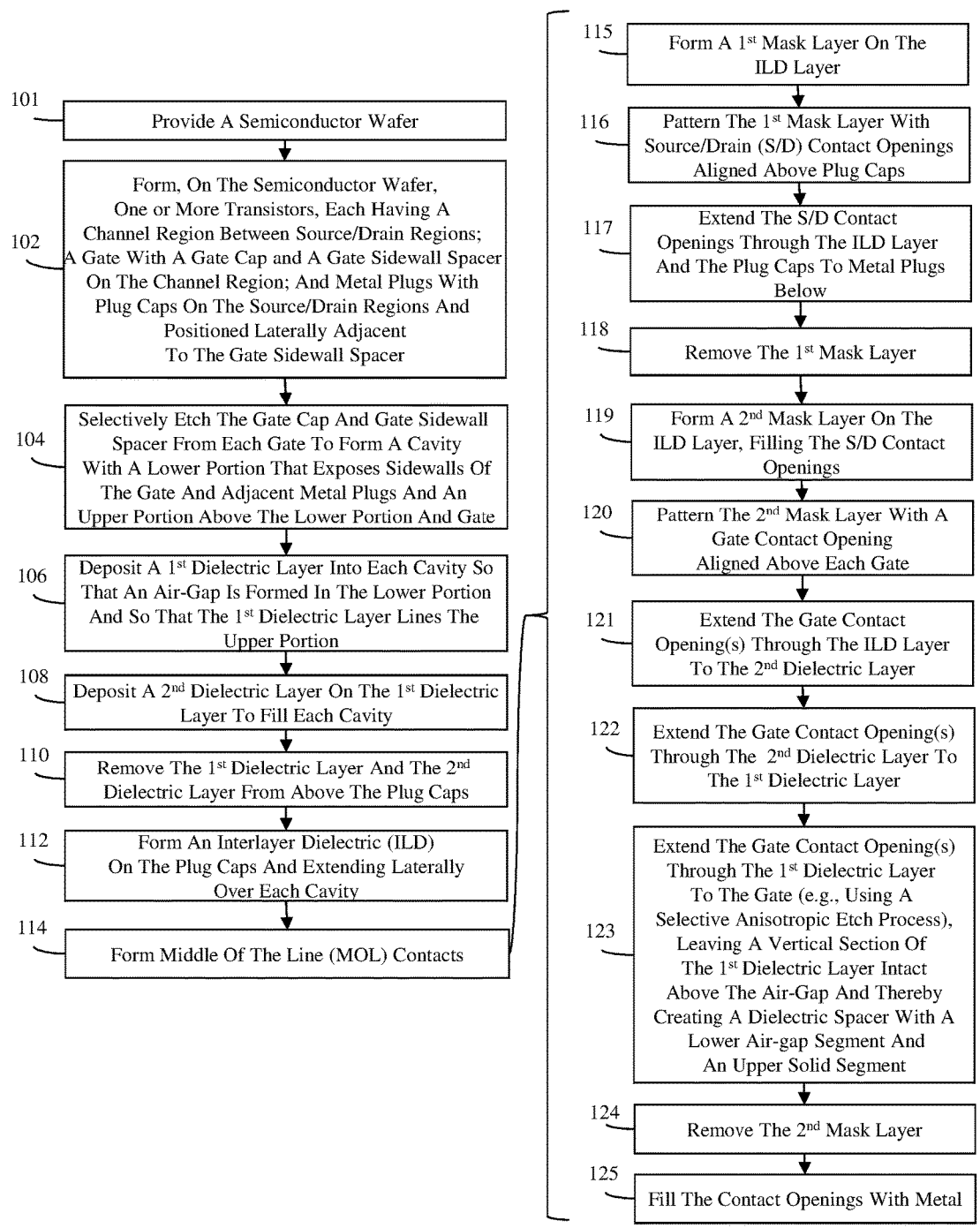
FIG. 1 is a flow diagram illustrating methods of forming an integrated circuit (IC) structure having one or more transistors, each with an air-gap gate sidewall spacer and, optionally, a gate contact over an active region (a CBoA) or close thereto.

As mentioned above, methods of forming integrated circuit (IC) structures have been developed that enable the formation of a field effect transistor (FET) with an air-gap gate sidewall spacer. With such an air-gap gate sidewall spacer parasitic capacitance (e.g., the capacitance between the FET gate and the metal plugs on the FET source/drain regions) is reduced as compared to a FET with a conventional gate sidewall spacer. Additionally, methods of forming integrated circuit (IC) structures have been developed that enable the formation of a FET with a gate contact over an active region (CBoA) to allow for area scaling. More specifically, middle of the line (MOL) contacts are contacts that connect field effect transistors (FETs) to the back end of the line (BEOL) metal levels. These MOL contacts include at least one gate contact (CB) and source/drain contacts (CAs). The gate contact extends vertically through the interlayer dielectric (ILD) material from a metal wire or via in the first BEOL metal level (referred to herein as the MO level) to the gate of the FET. Each source/drain contact extends vertically through the ILD material from a metal wire or via in the first BEOL metal level to a metal plug (TS), which is above and immediately adjacent to a source/drain region of the FET. Conventional techniques for forming these MOL contacts inherently include risks of the following: (a) shorts occurring between the gate contact and a metal plug, particularly, if the gate contact is over an active region or close thereto; and (b) shorts occurring between the source/drain contacts and the gate. However, new techniques have been developed that provide for the formation of these MOL contacts without incurring the above-mentioned risks of shorts. Unfortunately, the techniques used to form a FET with an air-gap gate sidewall spacer are currently incompatible with the techniques used to form a FET with a gate contact over an active region (CBoA).

In view of the foregoing, disclosed herein are integrated circuit (IC) structures having one or more transistors, each with an air-gap gate sidewall spacer and, optionally, a gate contact over an active region (a CBoA) or close thereto. In the methods, a gate with a sacrificial gate cap and a sacrificial gate sidewall spacer can be formed on a channel region and metal plugs with plug caps can be formed on source/drain regions. The sacrificial gate cap and sacrificial gate sidewall spacer can be selectively removed, thereby creating a cavity with a lower portion between the sidewalls of the gate and adjacent metal plugs on opposing sides of the gate and with an upper portion above the lower portion and the gate. A first dielectric layer can be deposited, forming an air-gap in the lower portion of the cavity and lining the upper portion. A second dielectric layer can be deposited on the first dielectric layer, filling the upper portion of the cavity. During formation of a gate contact opening for a gate contact, the second dielectric layer can be removed and the first dielectric layer can be anisotropically etched, thereby creating a dielectric spacer with a lower air-gap segment positioned laterally adjacent to the gate and an upper solid segment above the lower air-gap segment. Due to different dielectric materials used for the plug caps, for the first dielectric layer and for the second dielectric layer, this gate contact opening is self-aligned to the gate. Thus, the gate contact can be formed over an active region (or close thereto) without risk of shorting to an adjacent metal plug. Also disclosed herein are the resulting IC structures formed according to such methods.

Referring to the flow diagram of FIG. 1, generally in the methods disclosed herein a semiconductor wafer 203 is provided (101). The semiconductor wafer 203 provided at process 101 can be, for example, a semiconductor-on-insulator wafer (e.g., a silicon-on-insulator (SOI) wafer) that includes a semiconductor substrate 204 (e.g., a silicon substrate), an insulator layer 205 (e.g., a buried oxide (BOX) layer or other suitable insulator layer on the semiconductor substrate) and a semiconductor layer (e.g., a silicon layer or other suitable semiconductor layer) on the insulator layer 205 (see FIGS. 2A-2B). Alternatively, a bulk semiconductor wafer (e.g., a bulk silicon wafer or other suitable bulk semiconductor wafer) could be used.

At least one field effect transistor (FET) can be formed on the semiconductor wafer 203 (102). For purposes of illustration, the methods are described below and illustrated in the drawings with respect to the formation of two non-planar FET(s) (e.g., finFETs), which share a single semiconductor body (e.g., a single semiconductor fin) and which have the same type conductivity. However, it should be understood that the number and type of FETs being formed according to the methods is not intended to be limiting. For example, alternatively, the disclosed methods could be used to form multi-fin finFET(s), planar FET(s), FET(s) of different type conductivities, etc.

In any case, at process 102, at least one semiconductor body 210 can be formed. The semiconductor body 210 can, for example, be a semiconductor fin (i.e., a relatively thin rectangular or fin-shaped semiconductor body). The semiconductor body 210 can be patterned and etched from the semiconductor layer of the SOI wafer (or, alternatively, from the upper portion of a bulk semiconductor substrate, when isolation from the lower portion of the bulk semiconductor substrate is provided by buried well regions). Techniques for forming such a semiconductor body (e.g., lithographic patterning techniques or sidewall image transfer techniques) are well known in the art and, thus, the details have been omitted from this specification in order to allow the reader to focus on the salient aspects of the disclosed method.

Figure 2A:
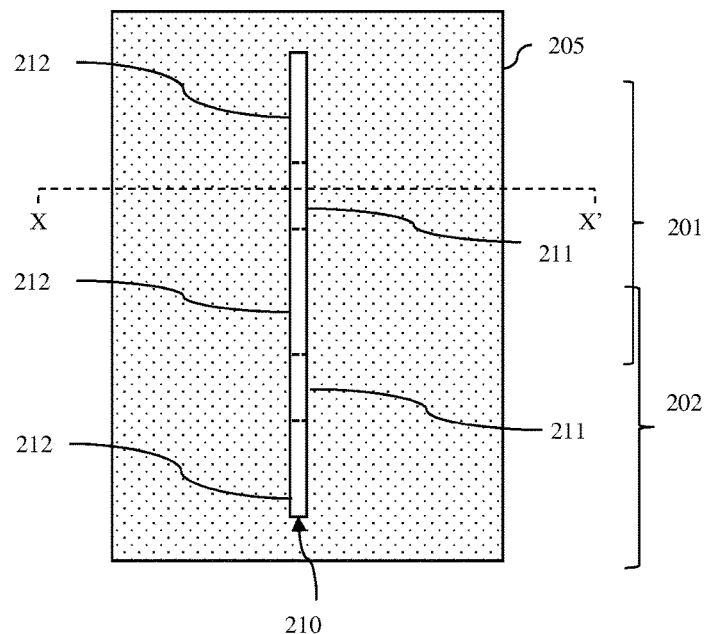
FIG. 2A and FIG. 2B are a top view diagram and a cross-section diagram, respectively, illustrating a partially completed structure formed according to the flow diagram of FIG. 1.
Figure 2B:
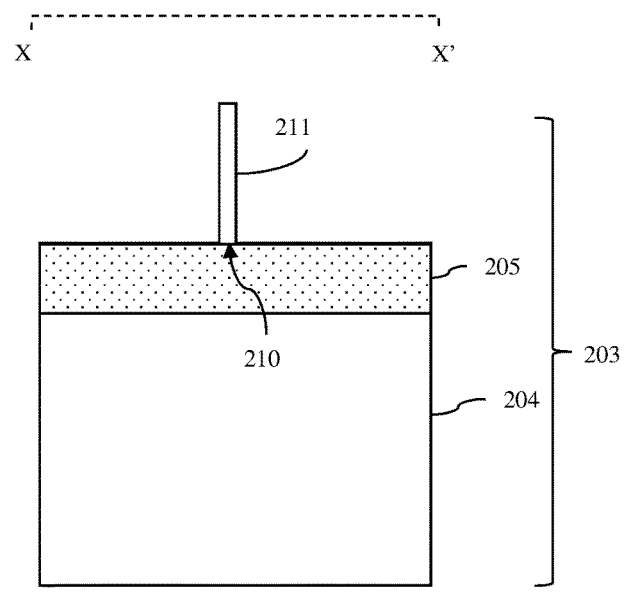

For each FET, the semiconductor body 210 can have areas designated for source/drain regions 212 and for a channel region 211, which is positioned laterally between the source/drain regions 212. For purposes of illustration, FIGS. 2A-2B show a single semiconductor fin 210 with a first channel region for a first finFET 201 and a second channel region for a second finFET 202, wherein the first channel region and the second channel region are separated by a shared source/drain region. In this case, the semiconductor body 210 can be doped with a first dopant, either before or after formation, so that each channel region 211 has a first type conductivity at a relatively low conductivity level. Alternatively, each channel region 211 can remain undoped.

For each FET, a gate, having a sacrificial gate cap and a sacrificial gate sidewall spacer, can be formed adjacent to the semiconductor body 210 at the channel region 211. The gate(s) can, for example, be formed using replacement metal gate formation techniques. Alternatively, the gate(s) can be formed using conventional gate-first gate formation techniques. For purposes of illustration, an exemplary replacement metal gate formation technique is described below.

Figure 3A:
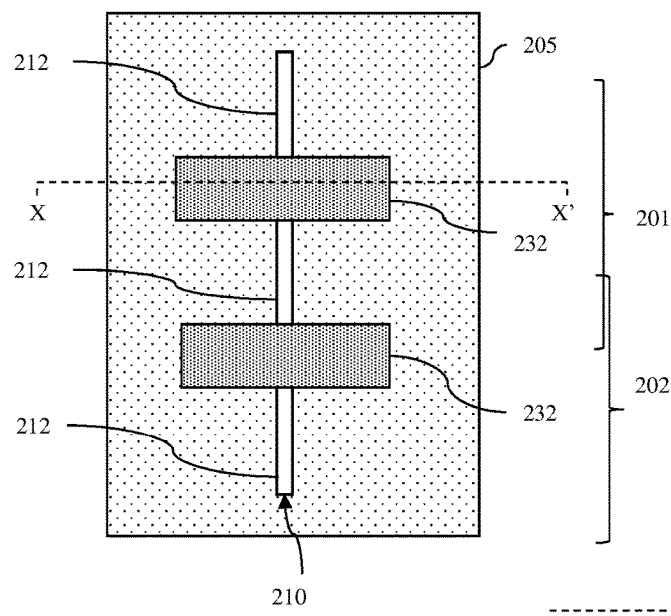
FIG. 3A and FIG. 3B are a top view diagram and a cross-section diagram, respectively, illustrating a partially completed structure formed according to the flow diagram of FIG. 1.
Figure 3B:
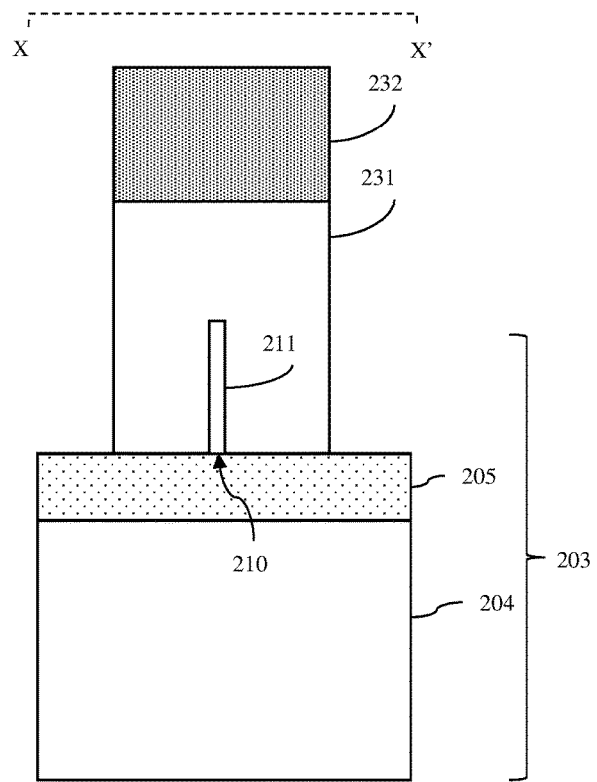
Figure 4:
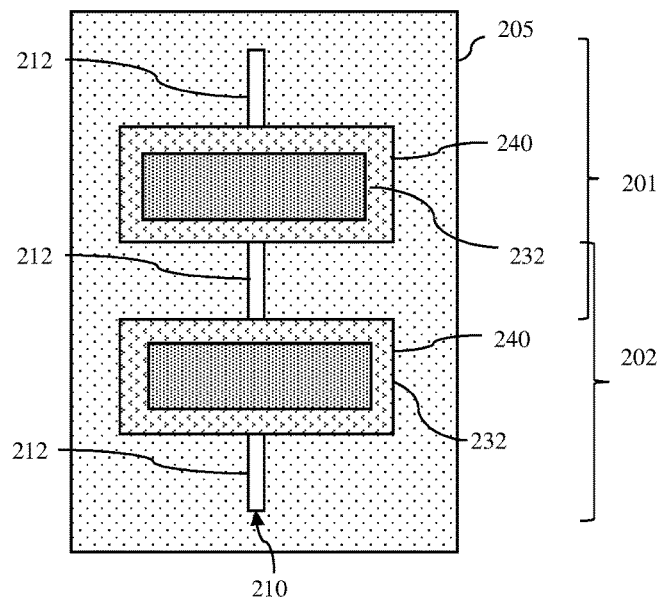
FIG. 4 is a top view diagram illustrating a partially completed structure formed according to the flow diagram of FIG. 1.

Specifically, a blanket first sacrificial layer (e.g., a sacrificial polysilicon layer, a sacrificial amorphous silicon layer or other suitable sacrificial layer) can be formed over the semiconductor body 210. A second sacrificial layer (e.g., a sacrificial nitride layer), which is different from the first sacrificial layer, can be formed on the top surface of the first sacrificial layer. The first and second sacrificial layers can then be patterned and etched to form, adjacent to each channel region 211, a sacrificial gate 231 (also referred to herein as dummy gates), having a first sacrificial gate cap 232. In the case of finFETs, each sacrificial gate 231 will be positioned above the top surface and adjacent to the opposing sides of the semiconductor body 210, as illustrated in FIGS. 3A-3B. Next, a sacrificial gate sidewall spacer 240 can be formed on the sidewalls of each sacrificial gate 231 (see FIG. 4). That is, a relatively thin conformal spacer layer (e.g., a silicon nitride layer) can be deposited over the partially completed structure. Then, an anisotropic etch process can be performed so as to remove the conformal spacer layer from horizontal surfaces and from the sidewalls of the semiconductor body 210 at the source/drain regions 212. Those skilled in the art will recognize that the height of the first sacrificial gate cap 232 on each sacrificial gate 231 should be approximately equal to or greater than the height of the semiconductor body 210 so that the conformal spacer layer can be removed from the sidewalls of the semiconductor body 210 at the source/drain regions 212 without exposing sacrificial gate sidewalls.

Figure 5:
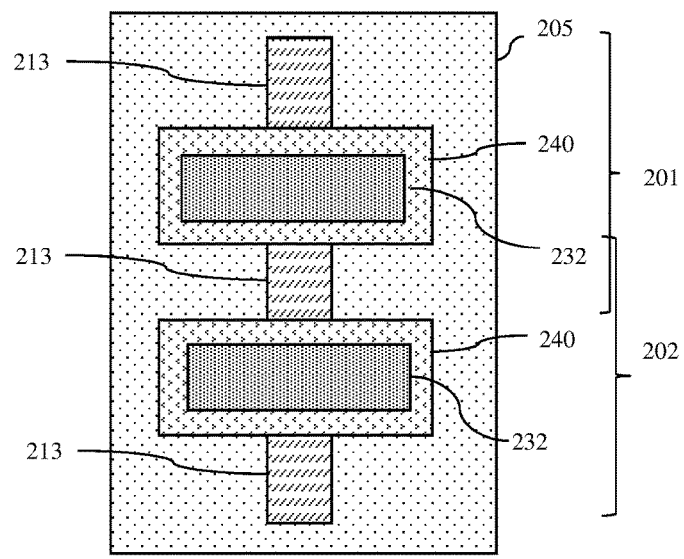
FIG. 5 is a top view diagram illustrating a partially completed structure formed according to the flow diagram of FIG. 1.
Figure 6A:
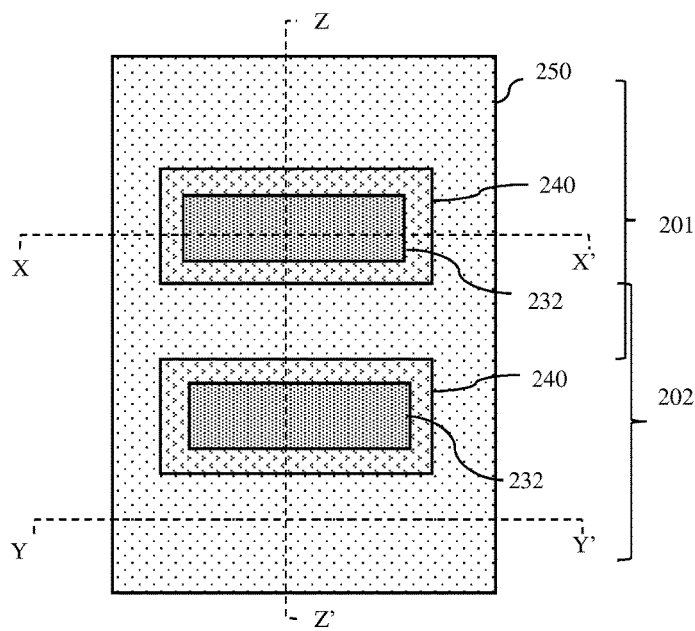
FIG. 6A and FIGS. 6B-D are a top view diagram and cross-section diagrams, respectively, illustrating a partially completed structure formed according to the flow diagram of FIG. 1.
Figure 6B:
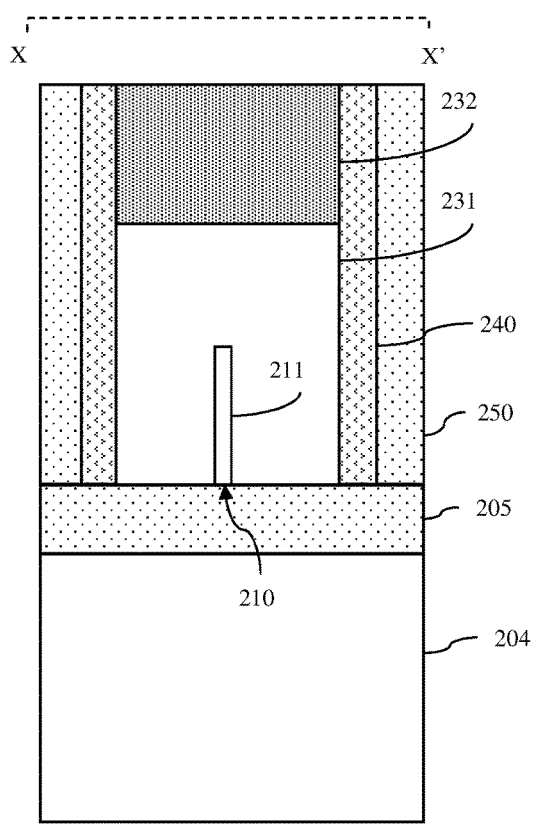
Figure 6C:
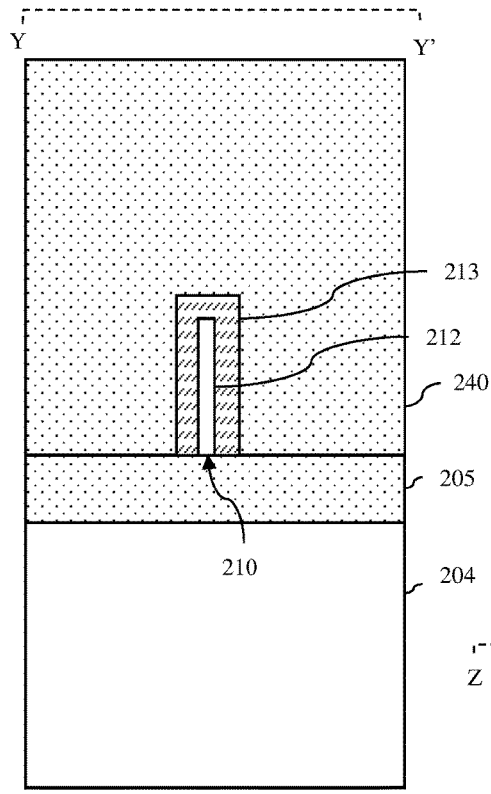
Figure 6D:
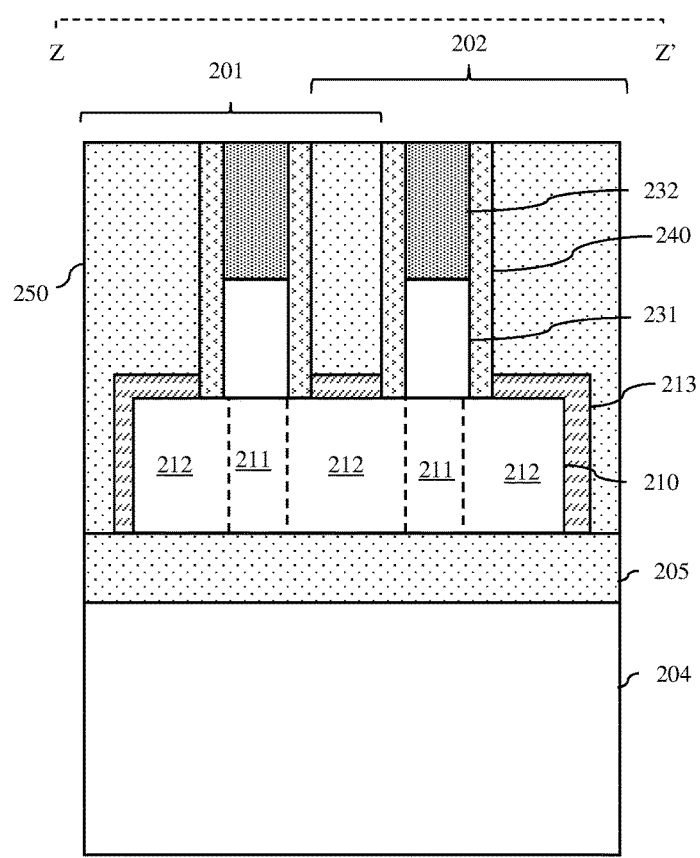
Figure 7A:
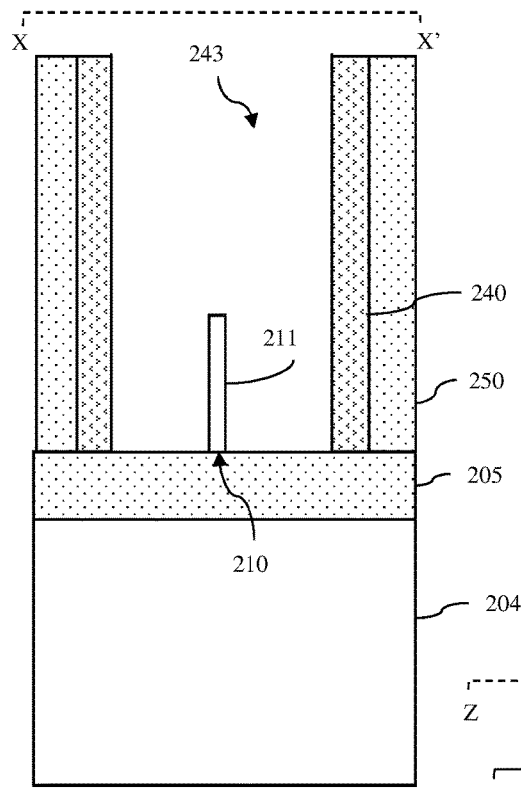
FIG. 7A and FIG. 7B are a top view diagram and a cross-section diagram, respectively, illustrating a partially completed structure formed according to the flow diagram of FIG. 1.
Figure 7B:
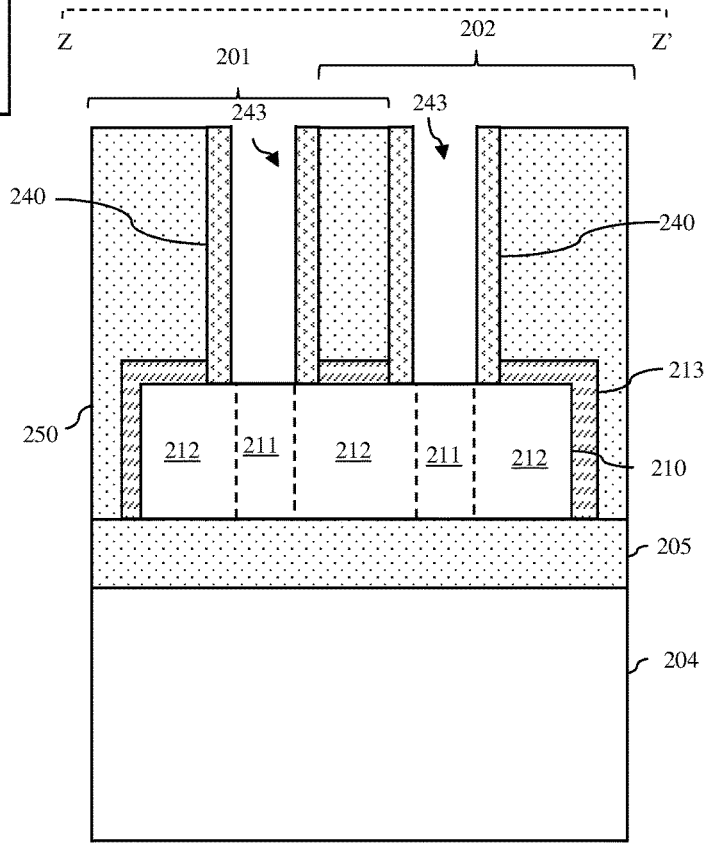
Figure 8A:
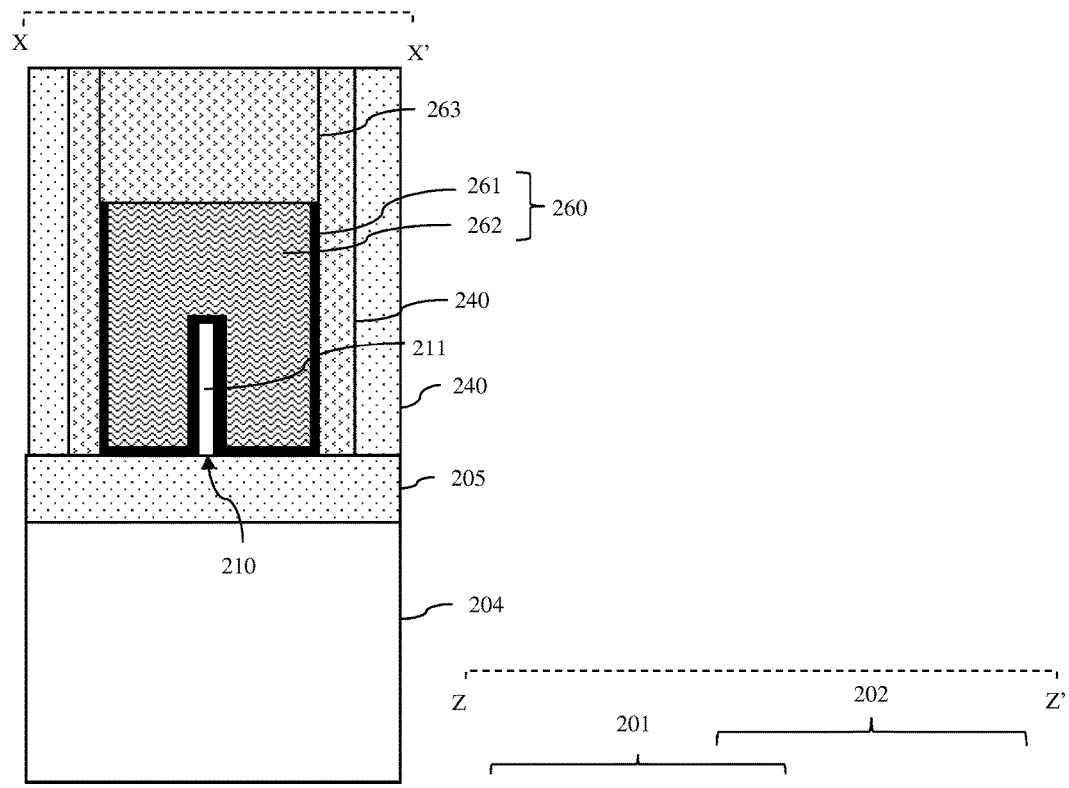
FIG. 8A and FIG. 8B are a top view diagram and a cross-section diagram, respectively, illustrating a partially completed structure formed according to the flow diagram of FIG. 1.
Figure 8B:
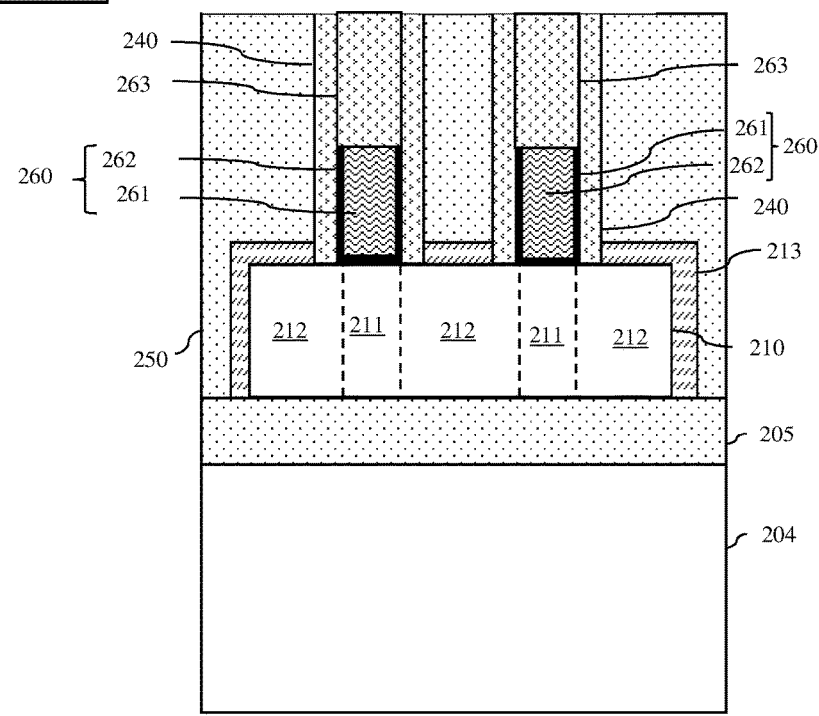
Figure 9A:
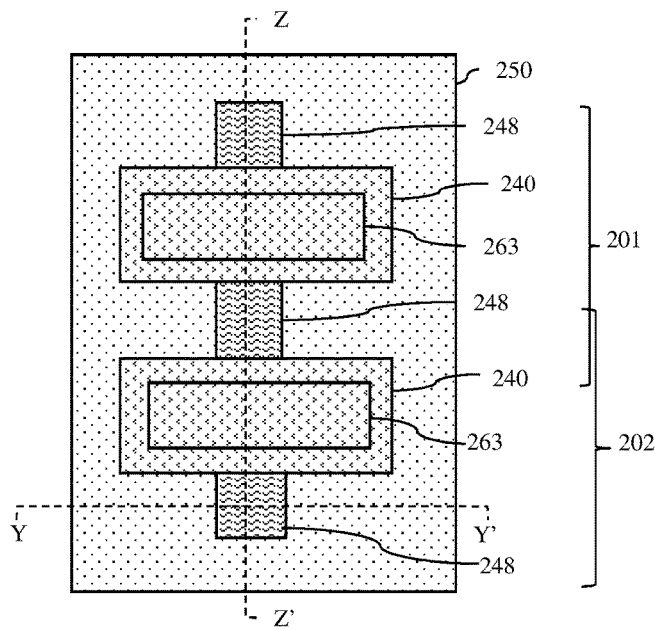
FIG. 9A and FIGS. 9B-9C are a top view diagram and cross-section diagrams, respectively, illustrating a partially completed structure formed according to the flow diagram of FIG. 1.
Figure 9B:
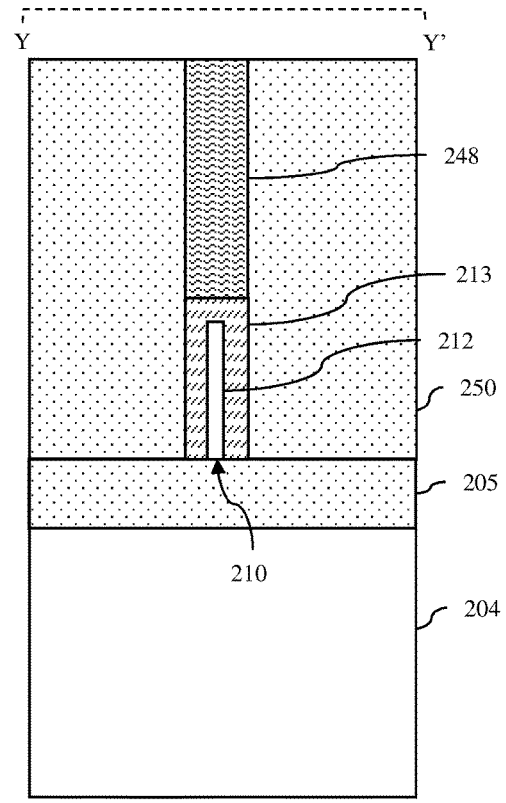
Figure 9C:
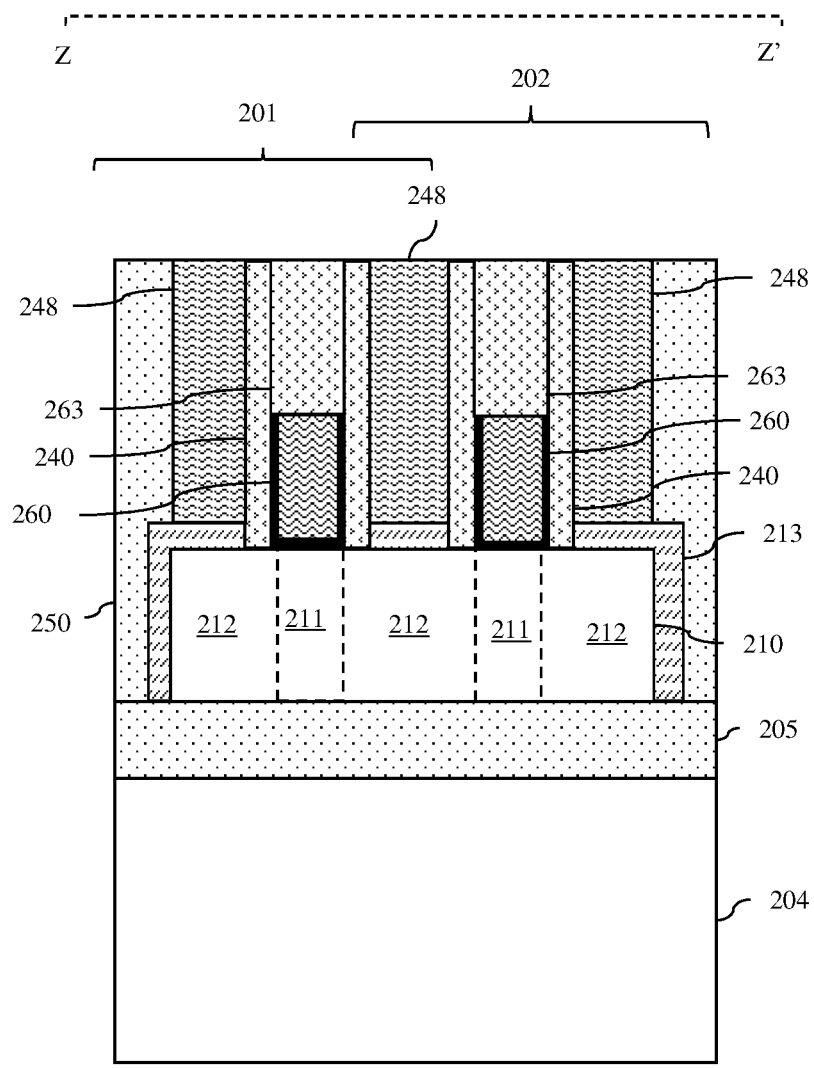
Figure 10A:
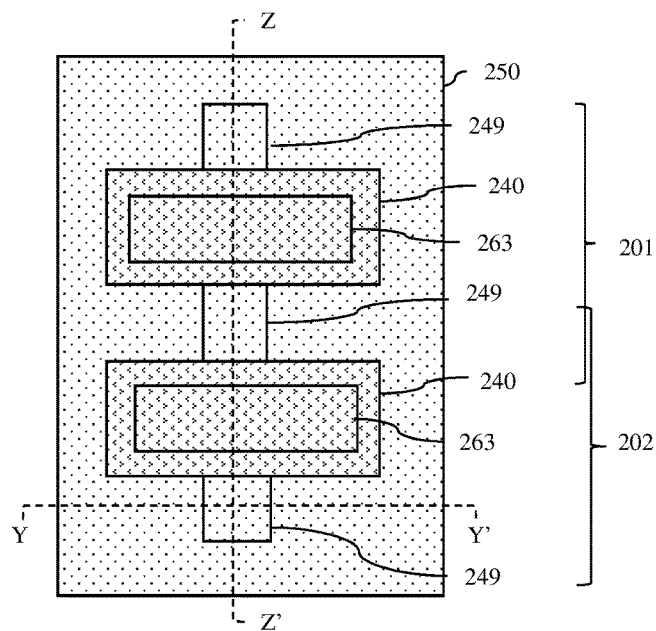
FIG. 10A and FIGS. 10B-10C are a top view diagram and cross-section diagrams, respectively, illustrating a partially completed structure formed according to the flow diagram of FIG. 1.
Figure 10B:
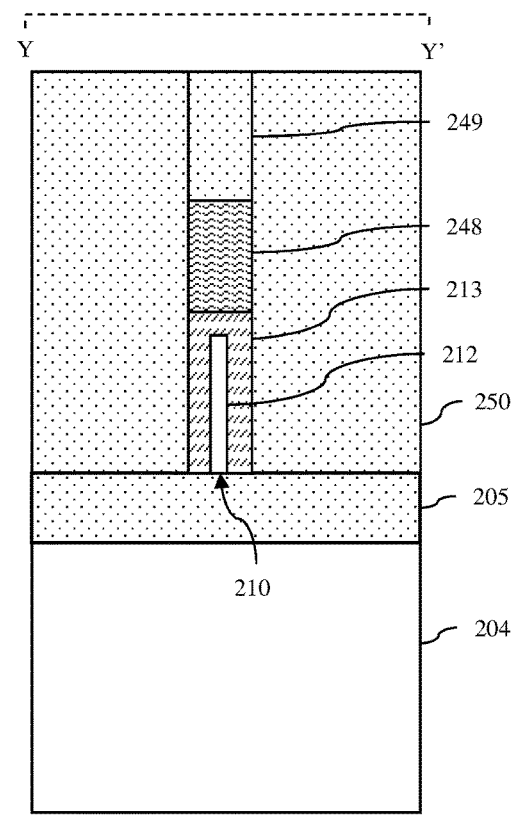
Figure 10C:
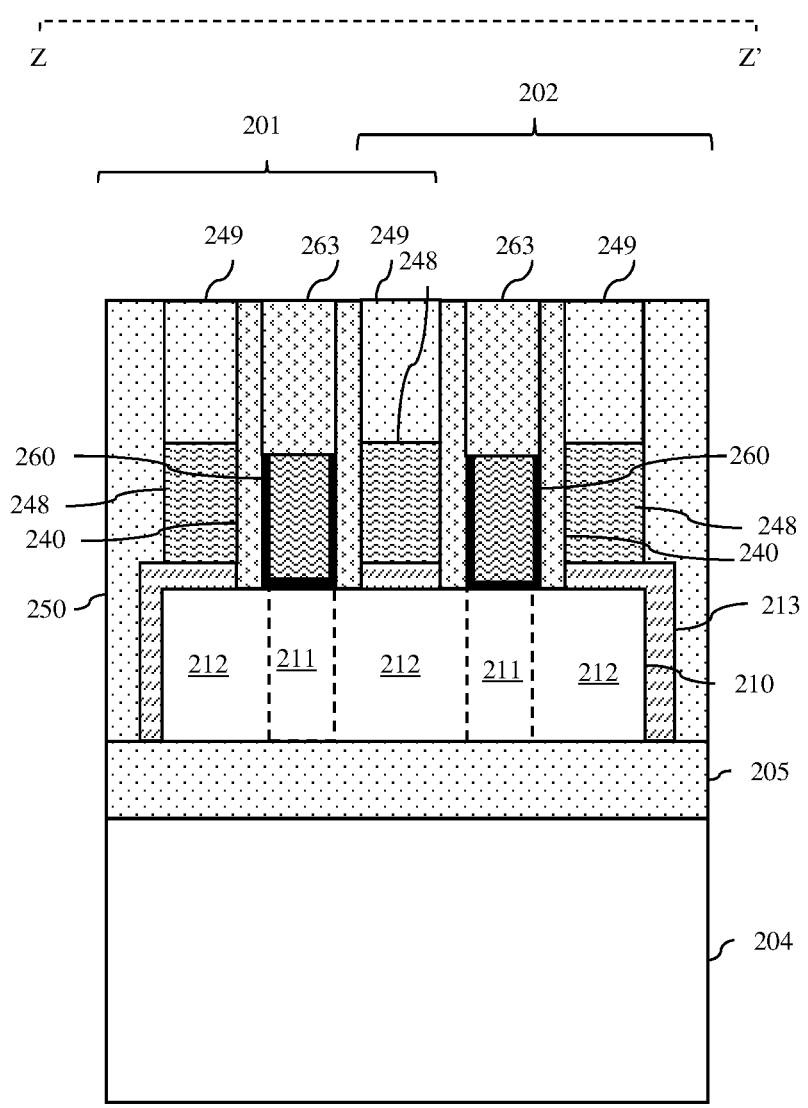

A dopant implant process can subsequently be performed so that the source/drain regions 212 have, for example, a second type conductivity at a relatively high conductivity level. Additionally or alternatively, epitaxial semiconductor material (e.g., epitaxial silicon or any other suitable epitaxial semiconductor material) can be deposited on exposed portions of the semiconductor body 210 (i.e., on the source/drain regions 212) to form raised epitaxial source/drain regions 213 (see FIG. 5). The epitaxial semiconductor material can be in-situ doped or subsequently implanted so that the raised epitaxial source/drain regions 213 have the second type conductivity at a relatively high conductivity level. Optionally, before depositing the epitaxial semiconductor material, as described above, the source/drain regions 212 can be recessed (not shown), thereby ensuring that the source/drain regions 212 and the raised epitaxial source/drain regions 213 will be doped so as to have the desired conductivity type and level.

Next, an interlayer dielectric (ILD) layer 250 can be formed over the partially completed structure and then planarized (see FIGS. 6A-6D). Specifically, a blanket ILD layer 250 (e.g., a blanket silicon oxide layer or other suitable blanket ILD layer) can be deposited so as to cover the first sacrificial gate cap 232 and sacrificial gate sidewall spacer 240 on each sacrificial gate 231 and so as to cover each source/drain region 212 (or raised epitaxial source/drain region 213, if applicable). A chemical mechanical polishing (CMP) process can then be performed in order to at least expose tops of each first sacrificial gate cap 232 and the adjacent sacrificial gate sidewall spacer 240.

The first sacrificial gate cap 232 and the sacrificial gate 231 below can then be removed and replaced with a replacement metal gate 260 having a second sacrificial gate cap 263 (see FIGS. 7A-7B and 8A-8B). For example, the sacrificial material of each first sacrificial gate cap 232 and sacrificial gate 231 can be selectively etched over the dielectric material used for the sacrificial gate sidewall spacer 240 and the ILD layer 250 (see FIGS. 7A-7B). Alternatively, the CMP process, which, as described above, is used to expose the tops of each first sacrificial gate cap 232 can be continued until each first sacrificial gate cap 232 is removed, thereby exposing the tops of each sacrificial gate 231. Each sacrificial gate 231 can then be selectively etched, thereby removing each sacrificial gate 231. In any case, removal of each first sacrificial gate cap 232 and each sacrificial gate 231 below will create gate opening(s) 243 in the ILD layer 250 above each channel region 211 and each gate opening 243 will have sidewalls lined with a sacrificial gate sidewall spacer 240.

A replacement metal gate 260 can then be formed in each gate opening 243 on the channel region 211 and immediately adjacent to the sacrificial gate sidewall spacer 240. For example, a conformal high-K gate dielectric layer 261 can be deposited so as to line the gate openings and one or more metal layers 262 can be deposited onto the gate dielectric layer 261. Those skilled in the art will recognize that the materials and thicknesses of the dielectric and metal layers used for replacement metal gates can be preselected to achieve desired work functions given the conductivity type of the FET. In any case, a chemical mechanical polishing (CMP) process can be performed to remove all gate materials from above the top surface of the ILD layer 250. The materials of the replacement metal gate 260 can then be recessed so that the top surface of each replacement metal gate is below the level of the top surface of the ILD layer 250 and a dielectric cap layer can be deposited and planarized in order to form a second sacrificial gate cap 263 above each replacement metal gate 260 (see FIGS. 8A-8B). The second sacrificial gate cap 263 can be made of the same material as the sacrificial gate sidewall spacer 240. For example, the second sacrificial gate cap 263 and the sacrificial gate sidewall spacer 240 can each be made of silicon nitride. Thus, each replacement metal gate 260 has sidewalls and a sacrificial gate sidewall spacer 240 positioned laterally immediately adjacent to those sidewalls and a top surface and a sacrificial gate cap 263 immediately adjacent to the top surface.

For each FET, metal plugs 248 with plug caps 249 can also be formed on the source/drain regions 212 (or, if applicable, on the raised epitaxial source/drain regions 213) so that each metal plug 248 is positioned laterally immediately adjacent to at least one sacrificial gate sidewall spacer 240 (see FIGS. 9A-9B and 10A-10C). To form metal plugs 248 with plug caps 249, metal plug openings can be formed (e.g., lithographically patterned and etched) through the ILD layer 250 to the source/drain regions 212 (or, if applicable, to the raised epitaxial source/drain regions 213, as illustrated). Then, metal plugs 248 can be formed in the metal plug openings. That is, metal (e.g., a tungsten, cobalt, aluminum or any other suitable metal plug material) can be deposited into the metal plug openings and a CMP process can be performed to remove the metal from above the top surfaces of the ILD layer 250 (see FIGS. 9A-9B). Additionally, an etch process can be performed to recess the metal plugs (i.e., to form a recess in the ILD layer 250 aligned above each of the metal plugs 248). It should be noted that this etch process can be performed so that the top surfaces of the metal plugs 248 are level with, lower than, or higher than the top surface of the adjacent replacement metal gate. Another dielectric cap layer can then be deposited and planarized in order to form a plug cap 249 within the recess above each metal plug 248 (see FIGS. 10A-10C). The plug cap 249 can specifically be made of a different material than the second sacrificial gate cap 263 and the sacrificial gate sidewall spacer 240. For example, the plug cap 249 can be made of the same dielectric material as the ILD layer 250 (e.g., silicon oxide).

Figure 11:
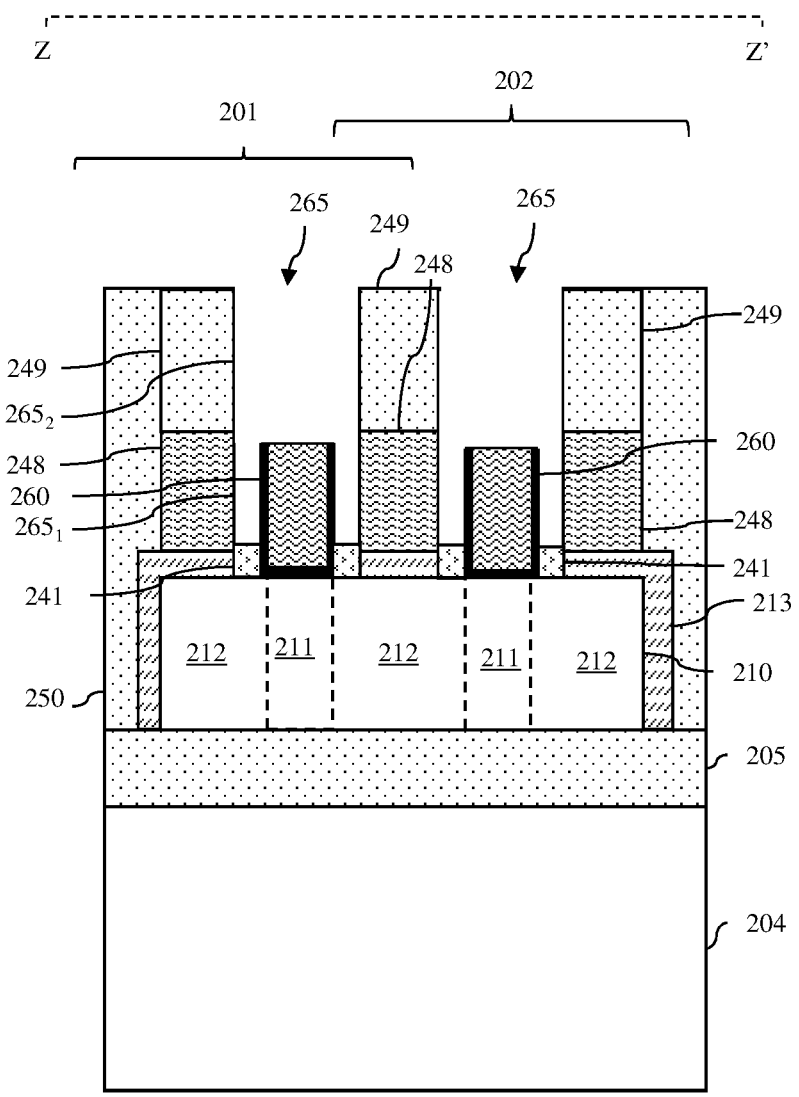
FIGS. 11-21 are a cross-section diagram illustrating partially completed structures formed according to the flow diagram of FIG. 1; and, FIG. 22 is a cross-section diagram illustrating a completed structure formed according to the flow diagram of FIG. 1.

Subsequently, the second sacrificial gate cap 263 and the sacrificial gate sidewall spacer 240, which as mentioned above can be made of the same dielectric material (e.g., silicon nitride) can be selectively etched away from each gate 260 (104, see FIG. 11). Etching of the second sacrificial gate cap 263 and the sacrificial gate sidewall spacer 240 creates a cavity 265 around the gate 260. The cavity 265 will have a lower portion $265_1$ and an upper portion $265_2$. The lower portion $265_1$ will expose sidewalls of the gate 260 and of the adjacent metal plugs 248 on opposing sides of the gate 260. The upper portion $265_2$ will be above the lower portion $265_1$ and the gate 260 and, thus, will expose sidewalls of the plug caps 249 on the adjacent metal plugs 248. It should be noted that the process 104 of etching away the second sacrificial gate cap 263 and the sacrificial gate sidewall spacer 240 from each gate 260 can be timed so that it stops prior to exposing the top surface of the semiconductor body 210 (and, if applicable, the raised epitaxial source/drain regions 213). Thus, a segment 241 of the sacrificial gate sidewall spacer 240 can remain on the top surface of the semiconductor body 210 immediately adjacent to the gate 260, as illustrated.

Figure 12:
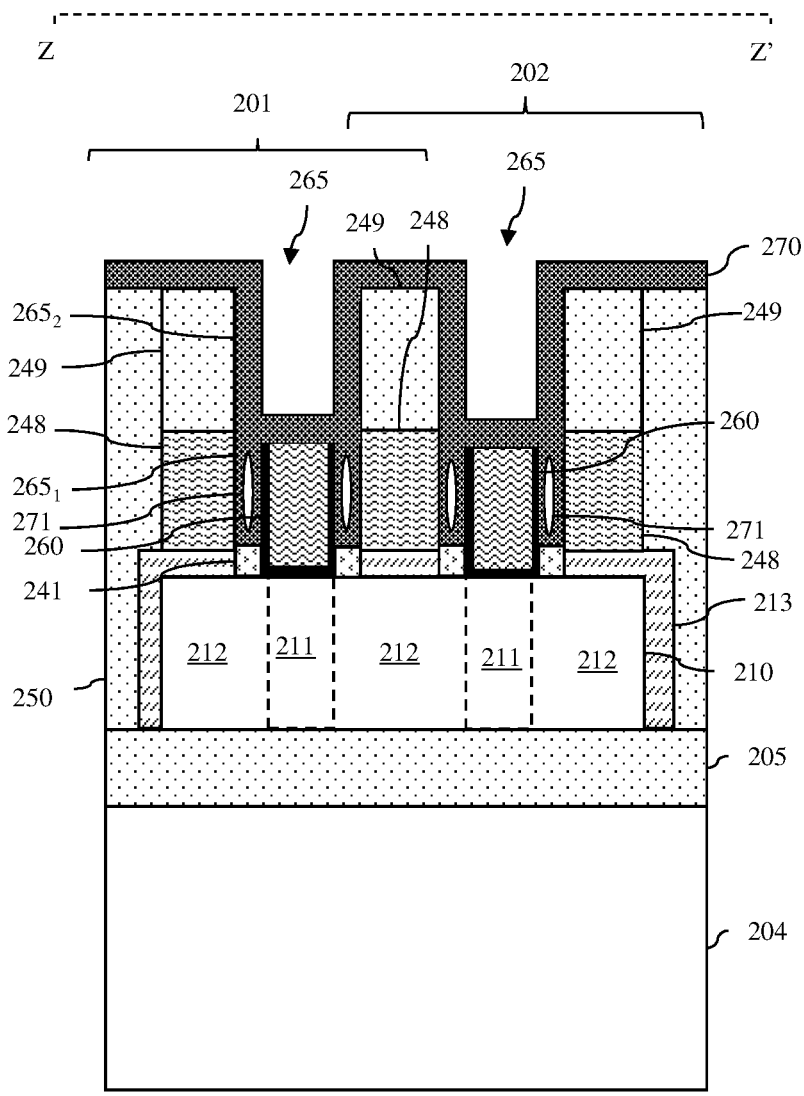

After the cavity is formed around each gate 260, a first dielectric layer 270 can be deposited over the ILD layer 250, the plug caps 249 and into each cavity 265 (106, see FIG. 12). The first dielectric layer 270 can be deposited so as to create an air-gap 271 in the lower portion $265_1$ of each cavity and so that the first dielectric layer 270 lines the upper portion $265_2$ of each cavity 265. For example, an atomic layer deposition (ALD) process can be tailored so that the resulting first dielectric layer 270 is semi-conformal in that it lines the upper portion $265_2$ of each cavity, but only partially lines the lower portion $265_1$, pinching off at the top of the narrow space between the gate 260 and adjacent metal plugs 248 before the lower portion $265_1$ of the cavity is either lined or filled. As a result, an air-gap 271 (also referred to a void) is created within the lower portion $265_1$ of the cavity 265 between the sidewalls of the gate 260 and the adjacent metal plugs 248. In the example provided the deposition process itself is tailored to ensure that the deposited first dielectric layer pinches off, thereby forming the required air-gap 271 in the lower portion of the cavity 265.

It should, however, be understood that other processes could, alternatively, be used to ensure formation of the air-gap 271 in the lower portion $265_1$ of the cavity 265 during deposition of the first dielectric layer 270. For example, although not shown, a T-shaped replacement metal gate could initially be formed in order to provide a very narrow space between the wide top section of the T-shaped gate and the adjacent metal plugs. As a result, when the first dielectric layer is deposited, pinch off would occur creating the air-gap 271 in the lower portion $265_1$. In this case, additional etch processes would be performed in order to remove the wide top section of the T-shaped gate and the first dielectric layer would be re-deposited in order to line the upper portion 265$_2$ of the cavity 265.

In any case, the first dielectric layer 270 can specifically be a different dielectric material than that used for the plug caps 249. For example, the first dielectric layer 270 can be made of silicon oxycarbide.

Figure 13:
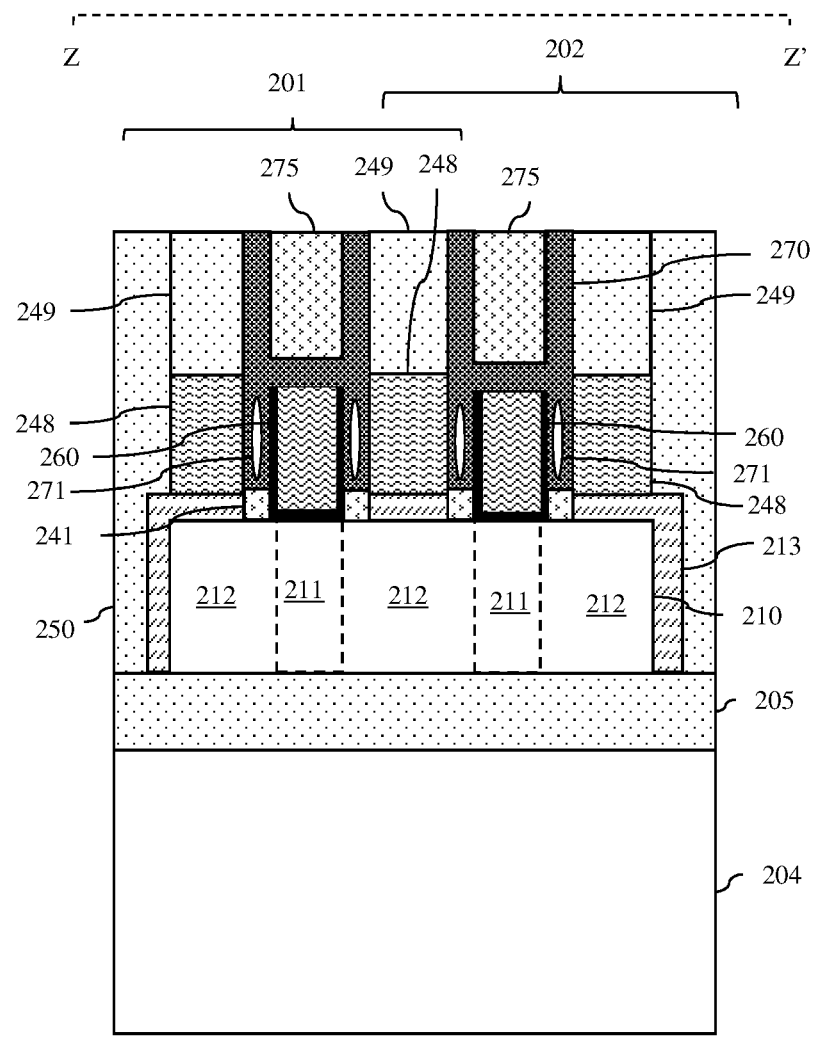

Next, a second dielectric layer 275 can be deposited onto the first dielectric layer 270 in order to fill the upper portion 265$_2$ of each cavity 265 (108, see FIG. 13). Optionally, the second dielectric layer 275 can be made of the same dielectric material as previously used for the sacrificial gate sidewall spacer 240. For example, the second dielectric layer 275 can be made of silicon nitride. In any case, the second dielectric layer 275 can be made of a different dielectric material than that of the first dielectric layer 270 and the plug caps 249. That is, the first dielectric layer 270, the second dielectric layer 275 and the plug caps 249 can be made of three different dielectric materials (e.g., silicon oxycarbide, silicon nitride, and silicon oxide, respectively). After the second dielectric layer 275 is deposited, the second dielectric layer 275 and the first dielectric layer 270 can be removed from above the plug caps 249 and ILD layer 250 (e.g., using a chemical mechanical polishing (CMP) process) (110).

Figure 14:
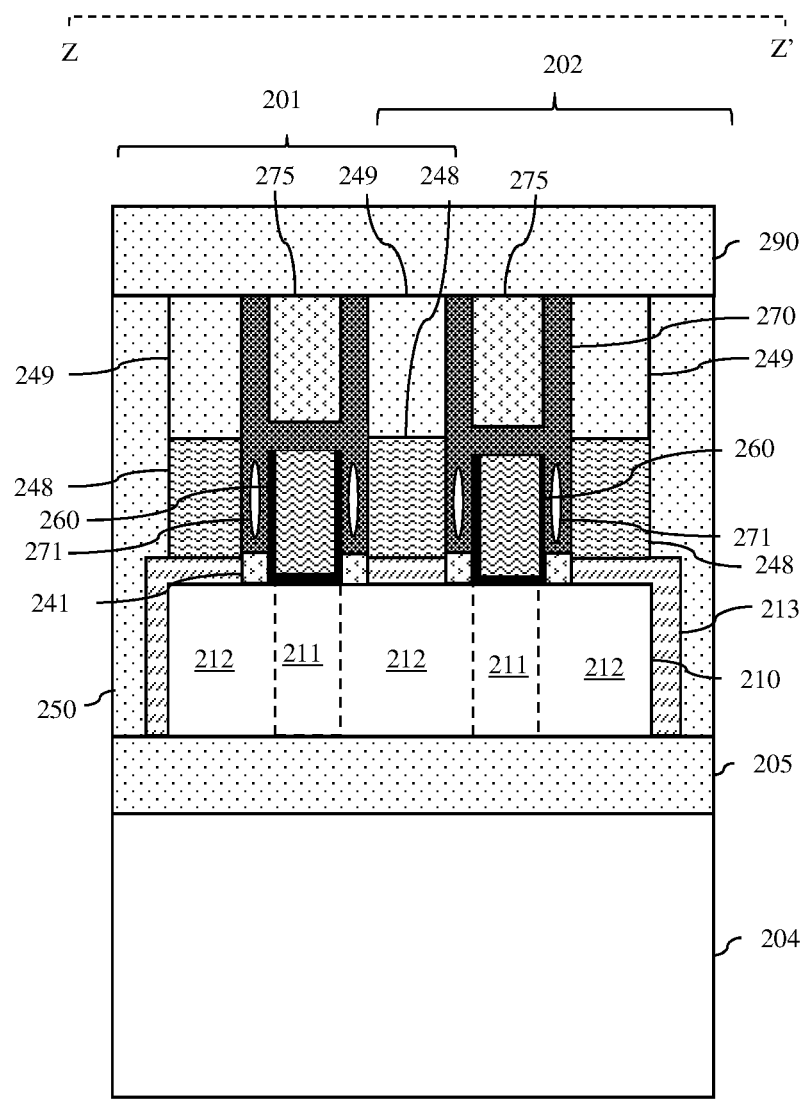
Figure 15:
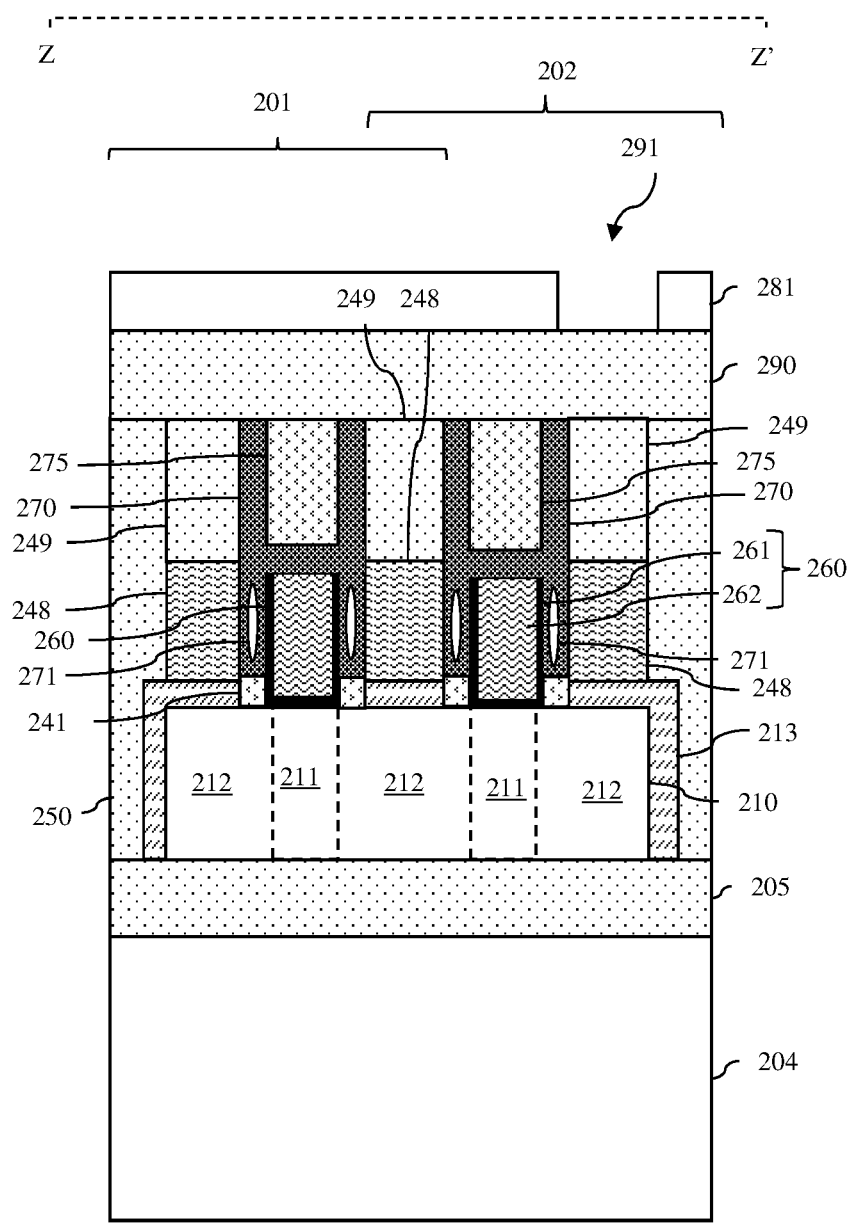
Figure 16:
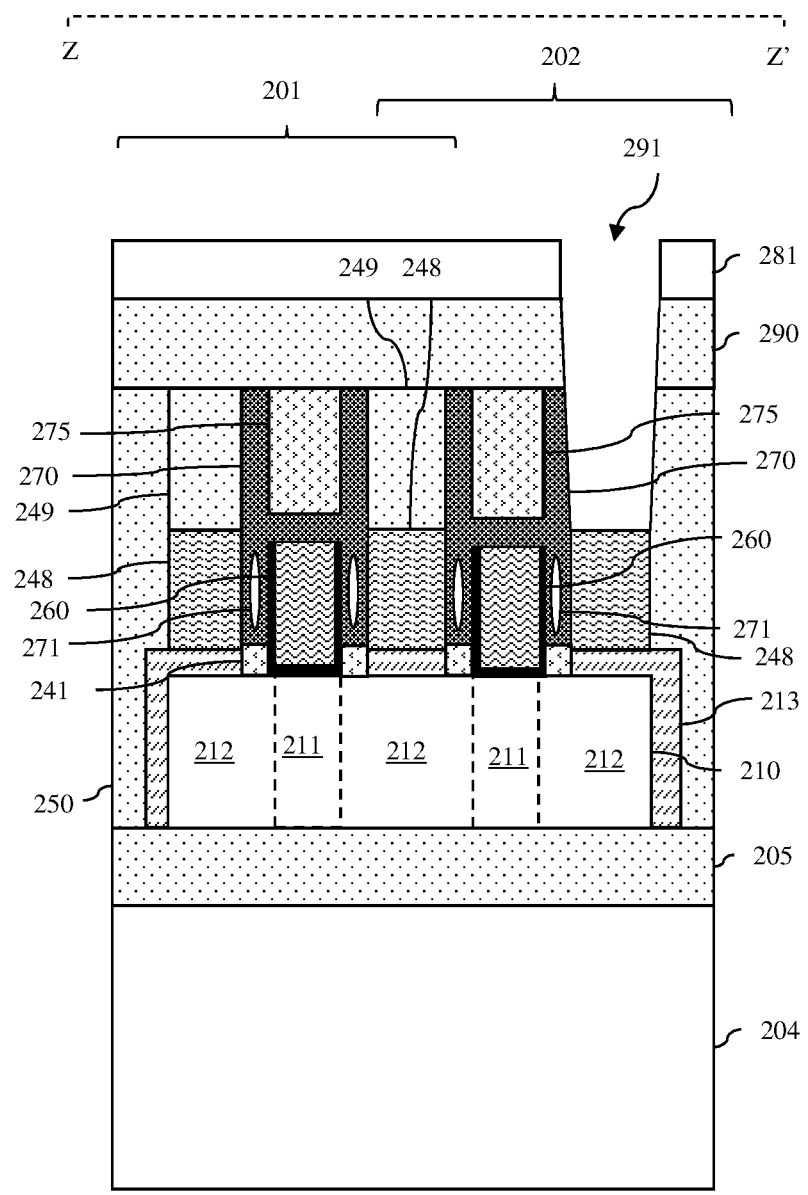

Another ILD layer 290 can then be formed (e.g., deposited) above and immediately adjacent to the essentially co-planar top surfaces of the ILD layer 250 and the plug caps 249 and further extending laterally over each cavity 265 so as to be above and immediately adjacent to the first dielectric layer 270, which lines the upper portion of the cavity, and the second dielectric layer 275, which is on the first dielectric layer 270 and fills the upper portion of the cavity (112, see FIG. 14). The ILD layer 290 can be made of the same dielectric material as the ILD layer 250 and plug caps 249 (e.g., silicon oxide).

Subsequently, middle of the line (MOL) contacts can be formed, which extend vertically through the ILD layer 290 down to the metal plugs 248 and gate 260 of each FET (114). Process steps for forming such MOL contacts are described in detail below and shown in FIGS. 15-22. It should be noted that because of space constraints and critical dimensions, typically, a gate contact to a gate of a given FET and source/drain contacts to metal plugs of the same FET will not be perfectly aligned along the length of the semiconductor body (i.e., along cross-section Z-Z' shown in the Figures). Thus, for purposes of illustration and to avoid clutter, formation of only two contact openings and corresponding contacts including, a gate contact opening and gate contact to the gate of the first FET 201 and a source/drain contact opening and source/drain contact to one of the metal plugs of the second finFET 202, is shown in the Figures. However, it should be understood other MOL contacts to each of the finFETs 201-202 would also simultaneously be formed outside the cross-section Z-Z' shown.

To form the MOL contacts at process 114, a first mask layer 281 (e.g., a first optical polymerization layer (OPL)) can be formed over the ILD layer 290 (115). The first mask layer 281 can be lithographically patterned with source/drain contact openings 291, which extend vertically through the first mask layer 281 to the ILD layer 290 and which are aligned above plug cap 249 (116, see FIG. 15). Next, the source/drain contact openings 291 can be extended through the ILD layer 290 and plug caps 249 to metal plugs 248 below (117, see FIG. 16). Since the dielectric material of the ILD layer 290 and plug caps 249 is the same (e.g., silicon oxide) and since this dielectric material is different from that of the first dielectric layer 270 and second dielectric layer 275 (e.g., silicon oxycarbide and silicon nitride, respectively), which line/fill the cavity above each gate 260, the process of extending the source/drain contact openings 291 can be an anisotropic etch process that is selective to the materials of the first dielectric layer 270 and the second dielectric layer 275. For example, this anisotropic etch process can be a conventional silicon oxide anisotropic etch that selectively etches a silicon oxide ILD layer 290 and silicon oxide plug caps 249 over a silicon oxycarbide first dielectric layer 270 and a silicon nitride second dielectric layer 275 (i.e., that etches silicon oxide at a significantly faster rate than silicon oxycarbide or silicon nitride) to expose the top of the metal plug 248 through the ILD oxide and the oxide plug cap 249 without (or only minimally) etching the first and second dielectric layers 270, 275, thereby ensuring that the gate 260 remains unexposed. Thus, this etch will be performed in a self-aligned manner, due to the existing etch selectivities between the different materials exposed in that system, making this process more robust versus process variabilities like lithographic overlay control etc.

Figure 17:
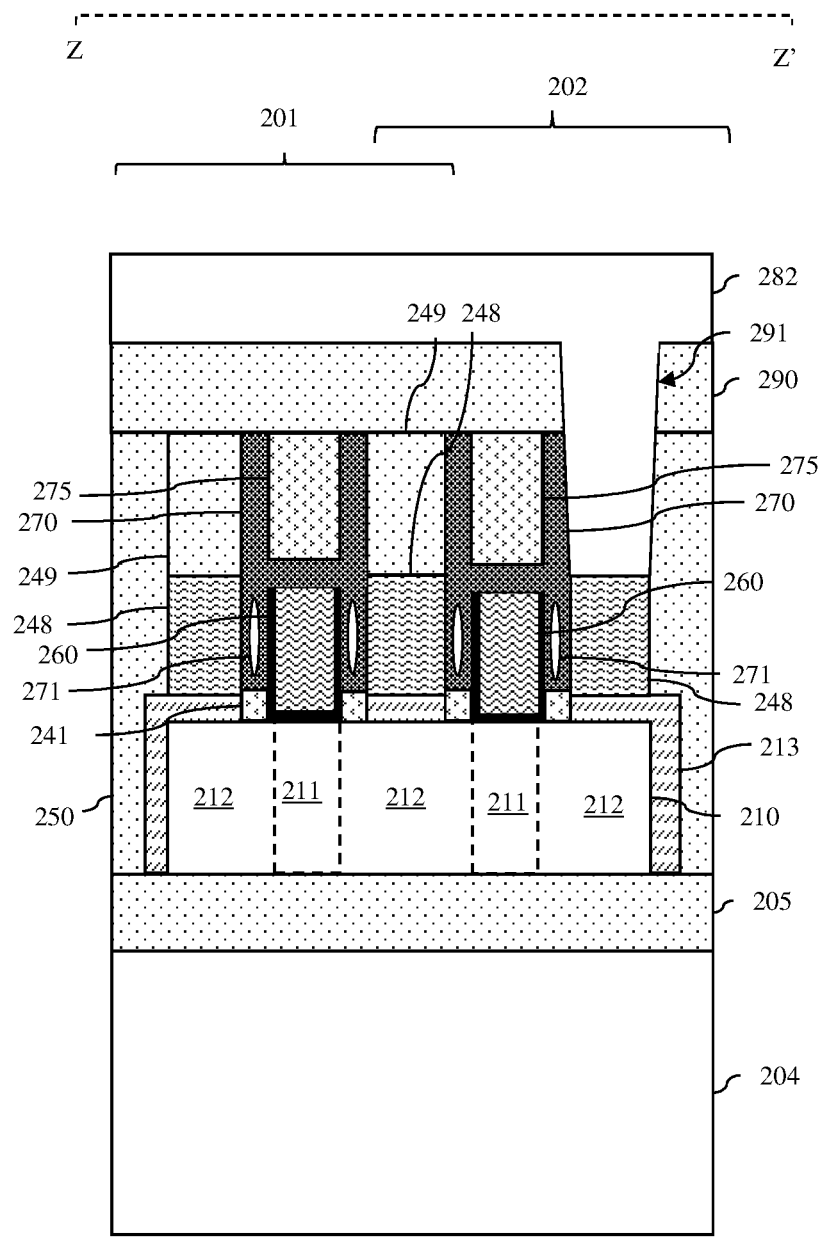
Figure 18:
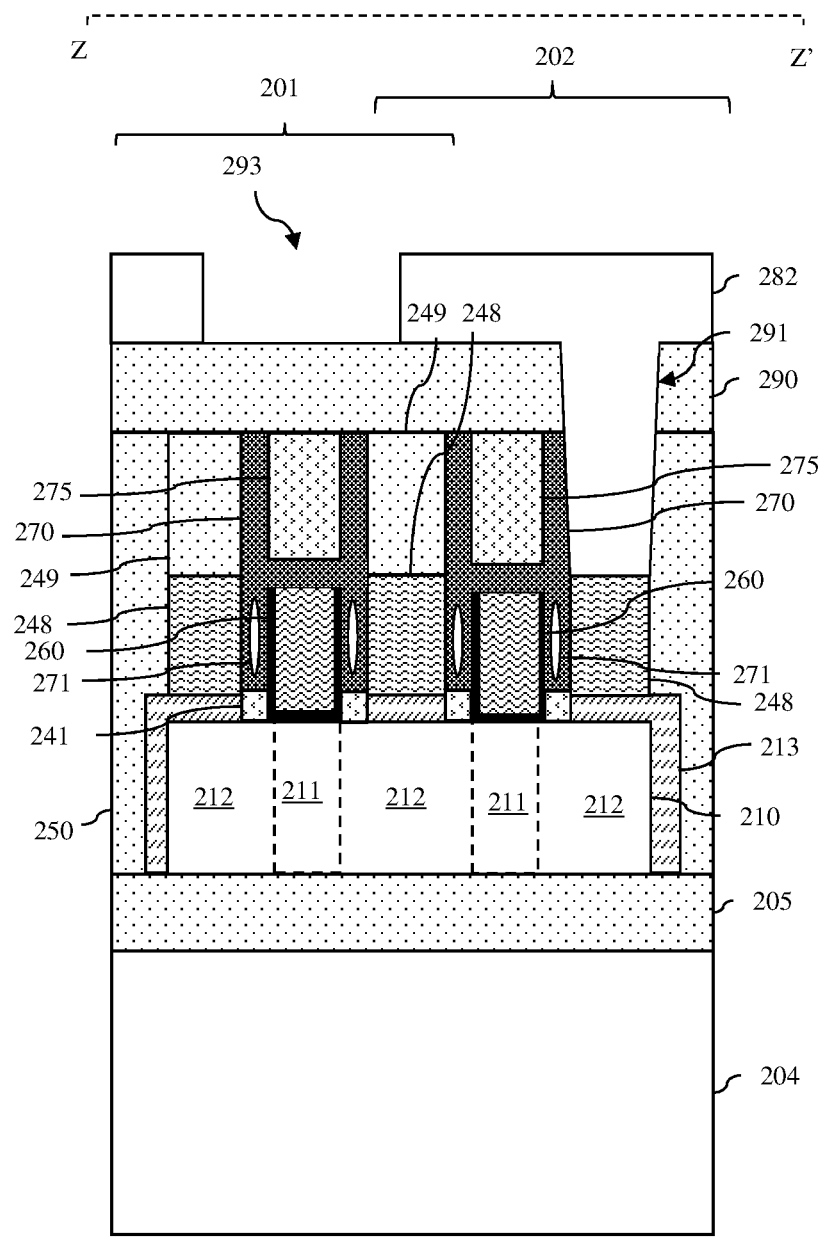
Figure 19:
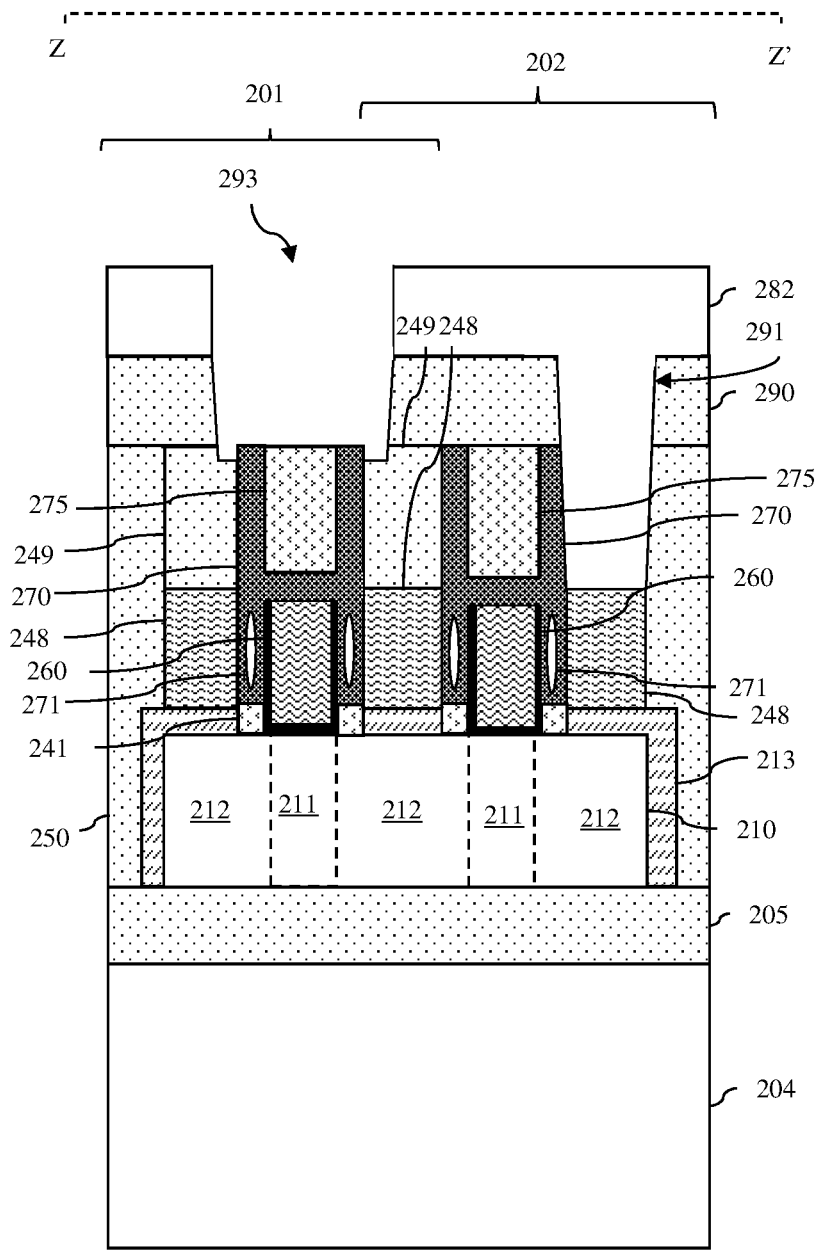

Once the source/drain contact openings 291 are extended to the metal plugs 248, the first mask layer 281 can be selectively removed (118) and a second mask layer 282 (e.g., a second OPL) can be formed on the ILD layer 290 (119, see FIG. 17). This second mask layer 282 can be lithographically patterned with at least one gate contact opening 293 to each gate of each FET being formed according to the method (120, see FIG. 18). Specifically, the gate contact opening(s) 293 can extend vertically through the second mask layer 282 to the ILD layer 290 and can be aligned above gate(s) 260.

Multiple selective etch processes can then be performed to extend the gate contact opening(s) 293 to the gate(s) 260 below. Specifically, the gate contact opening(s) 293 can be extended through the ILD layer 290, stopping on the second dielectric layer 275 below (121, see FIG. 19). Since the dielectric material of the ILD layer 290 (e.g., silicon oxide) is different from that of the first dielectric layer 270 and second dielectric layer 275 (e.g., silicon oxycarbide and silicon nitride, respectively) above the gate(s) 260, the process of extending the gate contact opening(s) 293 to the second dielectric layer 275 below can be an anisotropic etch process that is selective to the materials of the first dielectric layer 270 and the second dielectric layer 275. This etch process can, for example, be the same conventional silicon oxide anisotropic etch process used to etch the source/drain contact openings 291, as described above. Optimally, etching at process 121 will stop when the top surface of the second dielectric layer 275 is exposed. However, since the plug caps 249 and ILD layer 290 are made of the same material, divots may be formed in the plug caps 249 immediately adjacent to upper corners of the first dielectric layer 270, as illustrated. Thus, the height of the plug caps 249 and the timing of the etching at process 121 should be predetermined to ensure enough margin so that the metal plugs 248 are not exposed.

Figure 20:
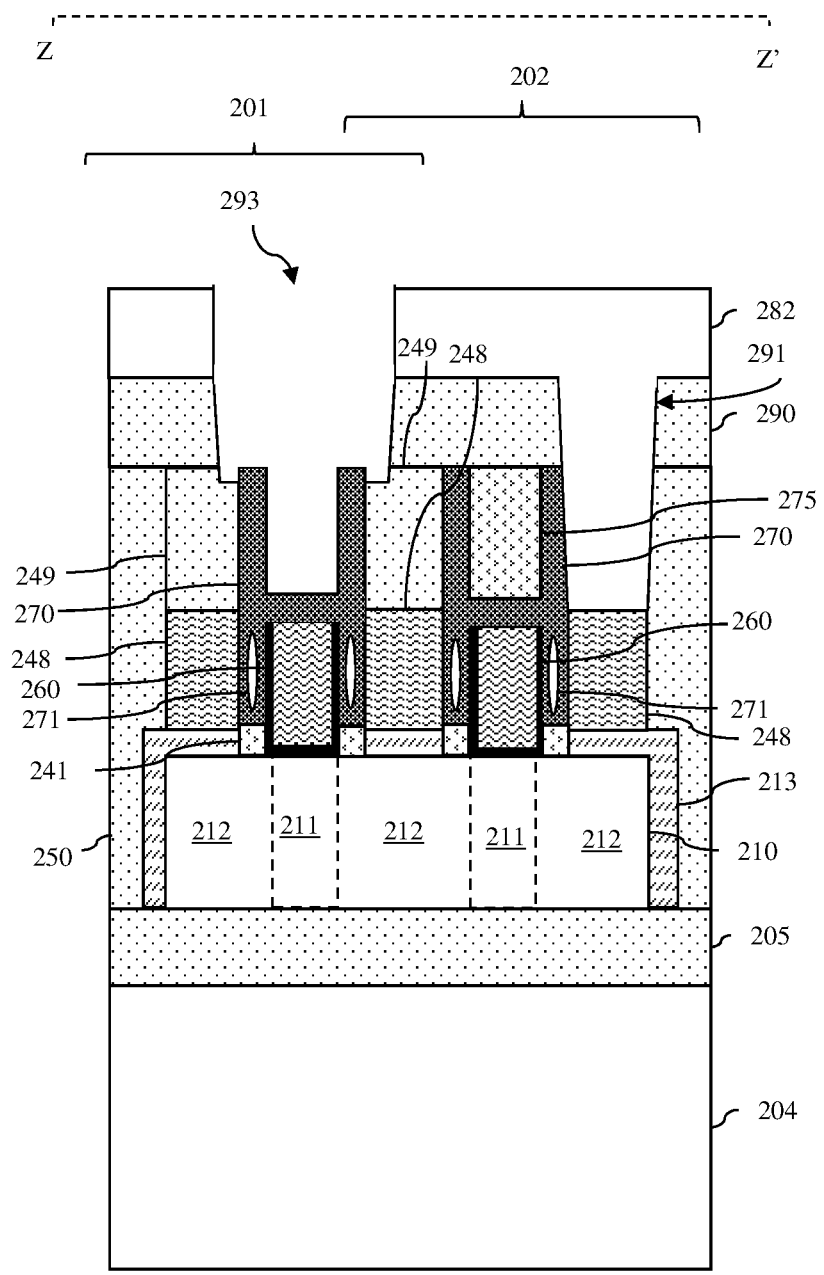

Each gate contact opening 293 can further be extended through an exposed portion of the second dielectric layer 275, stopping on a horizontal section of the first dielectric layer 270 below (122, see FIG. 20). Since the dielectric material of the second dielectric layer 275 (e.g., silicon nitride) is different from that of the first dielectric layer 270 and plug caps 249 (e.g., silicon oxycarbide and silicon oxide, respectively), the process of extending the gate contact opening(s) 293 to the horizontal section of the first dielectric layer 270 below can be an anisotropic etch process that is selective to the materials of the first dielectric layer 270 and the plug caps 249. For example, this anisotropic etch process can be a conventional silicon nitride anisotropic etch that selectively etches a silicon nitride second dielectric layer 275 over a silicon oxycarbide first dielectric layer 270 and silicon oxide plug caps 249 (i.e., that etches silicon nitride at a significantly faster rate than silicon oxycarbide and silicon oxide) in order to remove the second dielectric layer 275.

Figure 21:
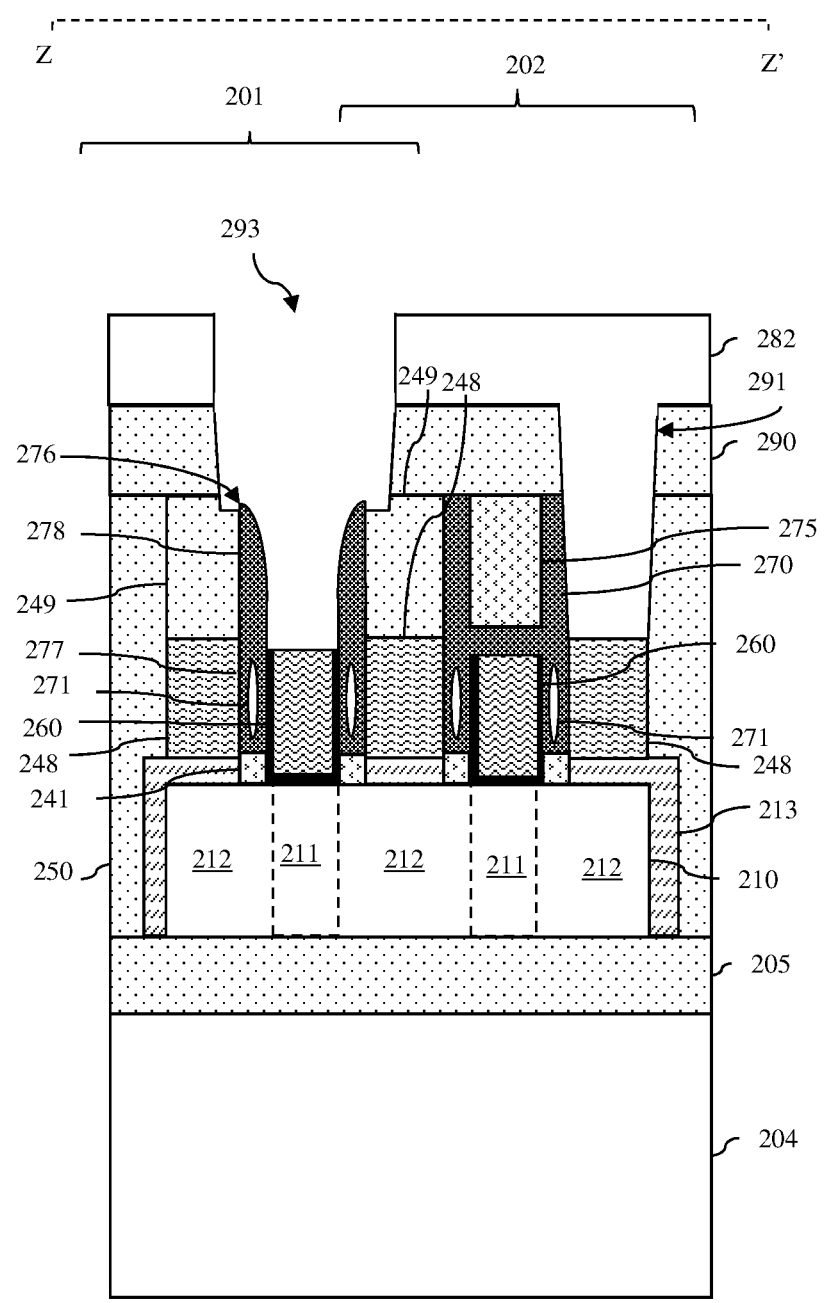

Each gate contact opening 293 can further be extended through an exposed portion of the horizontal section of the first dielectric layer 270, stopping on the gate 260 below (123, see FIG. 21). Since the dielectric material of the first dielectric layer 270 (e.g., silicon oxycarbide) is different from that of the plug caps 249 (e.g., silicon oxide), the process of extending the gate contact opening(s) 293 to the gate(s) 260 below can be an anisotropic etch process that is selective to the material of plug caps 249. For example, this anisotropic etch process can be a conventional silicon oxycarbide anisotropic etch process that selectively etches a silicon oxycarbide first dielectric layer 270 over silicon oxide plug caps 249 and the material of the gate 260 (i.e., that etches silicon oxycarbide at a significantly faster rate than silicon oxide or the gate materials) so as to remove the first dielectric layer 270 from the top of the gate 260 without (or only minimally) etching the plug caps 249, thereby exposing the gate 260 without exposing any adjacent metal plugs 248.

Additionally, since the etch process used to extend the gate contact opening(s) 293 to the gate(s) 260 below is anisotropic in nature, it will remove the exposed portion of the horizontal section of the first dielectric layer 270 from above the top surface of each gate, but will leave, intact, a vertical section of the first dielectric layer 270, which is positioned laterally adjacent to the plug caps 249 and which is above the air-gap 271. As a result, for each gate, a dielectric spacer 276 with a lower air-gap segment 277 and an upper solid segment 278 will be created (i.e., a spacer). The lower air-gap segment 277 of the dielectric spacer 276 will contain the air-gap 271 and will be positioned laterally between sidewalls of the gate 260 and of adjacent metal plugs 248 on opposing sides of the gate 260. The upper solid segment 278 of the dielectric spacer 276 will be essentially solid, will be above the lower air-gap segment 277 and will be positioned laterally immediately adjacent to sidewalls of plug caps 249 on the adjacent metal plugs 248. Thus, as with the etch process used to form the source/drain contact openings, the multiple selective etch processes used to extend the gate contact opening(s) 293 to the gate(s) 260 below will be performed in a self-aligned manner, due to the existing etch selectivities between the different materials exposed in that system, making this process more robust versus process variabilities like lithographic overlay control, etc.

Figure 22:
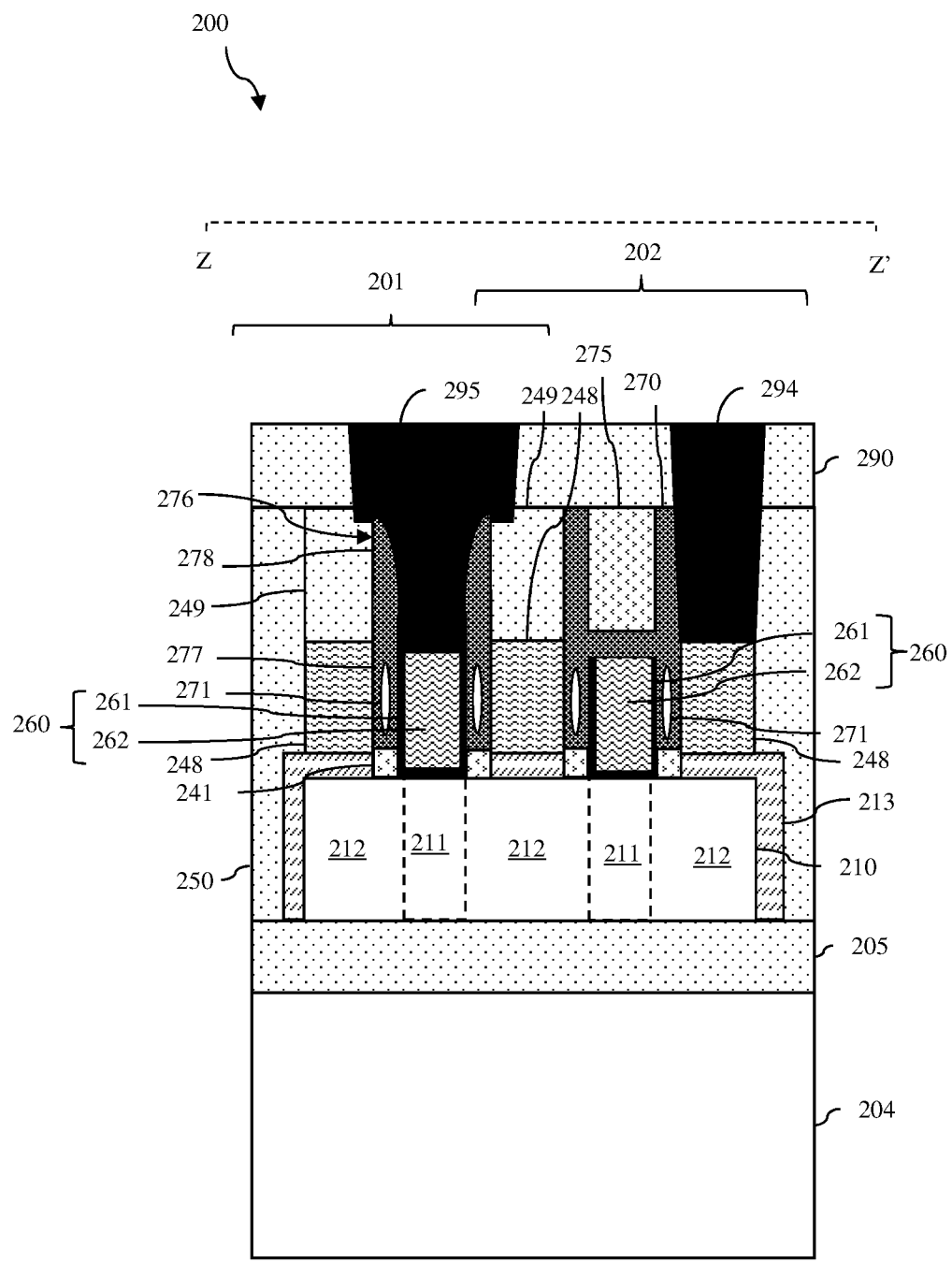

The second mask layer 282 can then be selectively removed (124) and a metal can be deposited to fill the source/drain and gate contact openings 291 and 293, thereby forming source/drain and gate contacts 294 and 295, respectively (125, see FIG. 22). The metal deposited at process 122 can be, for example, copper, tungsten, aluminum, cobalt, or any other metal material that is suitable for MOL contact formation. Techniques for depositing various metal materials to fill contact openings are well known in the art and, thus, the techniques are omitted from this specification in order to allow the reader to focus on the salient aspects of the disclosed methods.

It should be noted that, as a result of the three different dielectric materials used for the ILD layer 290 and plug caps 249 (e.g., silicon oxide), for the second dielectric layer 275 (e.g., silicon nitride) and for the first dielectric layer 270 (e.g., silicon oxycarbide), the selective etch process 117 described above can be performed so that the source/drain contact openings 291 are self-aligned to the metal plugs 248. That is, each source/drain contact opening 291 will land on a metal plug 248 with little or no risk of exposing the adjacent gate 260, even in the event that a source/drain contact opening 291 is wider than the metal plug and/or offset so as to overlap the gate. Thus, the disclosed methods avoid shorting of a source/drain contact 294 to an adjacent gate 260.

Similarly, due to three different dielectric materials used for the ILD layer 290 and plug caps 249 (e.g., silicon oxide), for the second dielectric layer 275 (e.g., silicon nitride) and for the first dielectric layer 270 (e.g., silicon oxycarbide), the selective etch processes 121-123 described above can be performed so that each gate contact opening 293 is self-aligned to the gate 260. That is, each gate contact opening 293 will land on a gate 260 with little or no risk of exposing an adjacent metal plug 248, even in the event that the gate contact opening 293 is wider than the gate and/or offset so as to overlap an adjacent metal plug. Therefore, a gate contact opening 293 and, thus, the gate contact 295 formed in that gate contact opening 293 can have a narrow portion, which is laterally surrounded by the upper solid segment 278 of the dielectric spacer 276, and a wider portion, which is above the narrow portion and which extends laterally over the upper solid segment 278 of the dielectric spacer 276 (e.g., onto the plug caps 249). Thus, the disclosed methods avoid shorting of a gate contact 295 to an adjacent metal plug 248. So, optionally, a gate contact opening 293 and, more particularly, the gate contact 295 in that gate contact opening can be formed over an active region of the FET (e.g., directly above the channel region 211 as shown in FIGS. 21 and 22) or close thereto to minimize device size without risk of shorting to an adjacent metal plug.

Referring to FIG. 22, also disclosed herein are integrated circuit (IC) structures formed according to the above-described methods so as to have one or more transistors each with an air-gap gate sidewall spacer and, optionally, a gate contact over an active region (i.e., a CBoA) or close thereto. For purposes of illustration, the IC structures disclosed herein are described below and illustrated in the drawings with respect to two non-planar FET(s) (i.e., a first finFET 201 and a second finFET 202), which share a single semiconductor body (e.g., a single semiconductor fin) and which have the same type conductivity. However, it should be understood that the number and type of FETs shown is not intended to be limiting. For example, alternatively, such an IC structure could include multi-fin finFET(s), planar FET(s), FET(s) of different type conductivities, etc.

In any case, each IC structure 200 disclosed herein can incorporate at least one transistor (e.g., see first transistor 201 and second transistor 202).

Each transistor 201, 202 can have a semiconductor body 210 (e.g., a semiconductor fin, such as a silicon fin) and, within the semiconductor body 210, a channel region 211 that is positioned laterally between source/drain regions 212. The channel region 211 can be doped, for example, with a first dopant so as to have a first type conductivity at a relatively low conductivity level. The source/drain regions 212 can be doped, for example, with a second dopant so as to have a second type conductivity at a relatively high conductivity level. Optionally, epitaxial semiconductor material (e.g., epitaxial silicon or any other suitable epitaxial semiconductor material) can be grown on the source/drain regions 212, thereby forming raised epitaxial source/drain regions 213 (as shown). The epitaxial semiconductor material can be in-situ doped or subsequently implanted so that the raised epitaxial source/drain regions 213 have the second type conductivity at a relatively high conductivity level. Optionally, the semiconductor body 210 can be recessed at the source/drain regions 212 (i.e., the semiconductor body 210 can have recessed source/drain regions 212) and the epitaxial source/drain regions 213 can be on the recessed source/drain regions (not shown).

Each transistor 201, 202 can further have a gate 260 adjacent to the semiconductor body 210 at the channel region 211. The gate 260 can be a replacement metal gate. For example, the gate 260 can include conformal high-K gate dielectric layer 261 and one or more metal layers 262 on the gate dielectric layer 261. Those skilled in the art will recognize that the materials and thicknesses of the dielectric and metal layers used for replacement metal gates can be preselected to achieve desired work functions given the conductivity type of the FET. Alternatively, the gate 260 could be a conventional gate-first gate with, for example, a silicon dioxide gate dielectric layer and a doped polysilicon gate conductor layer.

Each transistor 201, 202 can further have metal plugs 248 on the source/drain regions 212 (or, if applicable, on the raised epitaxial source/drain regions 213) and plug caps 249 above and immediately adjacent to the metal plugs 248. The metal plugs 248 can be made, for example, of tungsten, cobalt, aluminum or any other suitable metal plug material. The plug caps 249 can be dielectric plug caps made, for example, of silicon oxide.

Each transistor 201, 202 can further have middle of the line (MOL) contacts. Specifically, each transistor 201, 202 can include source/drain contacts 294, which extend vertically through an interlayer dielectric (ILD) layer 290 (e.g., a silicon oxide ILD layer) and further down to the metal plugs 248 and a gate contact 295, which extends vertically through the ILD layer 290 and further down to the gate 260. It should be noted that because of space constraints and critical dimensions, typically, a gate contact 295 to a gate 260 of a given FET and source/drain contacts 294 to metal plugs 248 of the same FET will not be perfectly aligned along the length of the semiconductor body 210 (i.e., along cross-section Z-Z' shown in the FIG. 22). Thus, for purposes of illustration, only two MOL contacts are shown in FIG. 22: a gate contact 295 to the gate 260 of the first transistor 201 and a source/drain contact 294 to one of the metal plugs 248 of the second transistor 202. However, it should be understood that the IC structure 200 would also include other MOL contacts to each of the transistor 201-202 outside the cross-section Z-Z' shown.

Each transistor 201, 202 can further have a dielectric spacer 276, which has a lower air-gap segment 277 and an upper solid segment 278. The lower air-gap segment 277 and the upper solid segment can each be made of the same dielectric material, which is different than that of the plug caps 249. For example, the lower air-gap segment 277 and the upper solid segment can each be made of silicon oxycarbide. The lower air-gap segment 277 can contain an air-gap 271 within the dielectric material (e.g., within the silicon oxycarbide) and can be positioned laterally between and immediately adjacent to sidewalls of the gate 260 and adjacent metal plugs 248 on opposing sides of the gate 260. The upper solid segment 278 can be above the lower air-gap segment 277 and positioned laterally between and immediately adjacent to the gate contact 295 and adjacent plug caps 249 above metal plugs 248. Optionally, the dielectric spacer 276 can have an additional segment 241 between the semiconductor body 210 and the lower air-gap segment 277. This additional segment 241 of the dielectric spacer 276 can be made of a different dielectric material than that of the segments above and also a different dielectric material than the plug caps 249. For example, the additional segment 241 of the dielectric spacer 276 can be made of silicon nitride and, particularly, can be a remaining portion of a silicon nitride sacrificial gate sidewall spacer 240 that was etched away from the gate 260 during processing, as discussed in detail above with regard to the methods.

Thus, in the IC structures 200, the upper solid segment 278 and the lower air-gap segment 277 of the dielectric spacer 276, the optional additional segment 241 of the dielectric spacer 276, and the plug caps 249 and ILD layer 290 can be made of three different dielectric materials (e.g., silicon oxycarbide, silicon nitride, and silicon oxide, respectively).

It should be noted that, as a result of the different dielectric materials used during processing (see the detail discussion above with regard to the methods), each source/drain contact 294 will land on a metal plug 248 and the upper solid segment 278 of the dielectric spacer 276 will prevent shorting of that source/drain contact 294 to an adjacent gate 260, even if the source/drain contact opening used for that source/drain contact was patterned to be wider than the metal plug and/or offset from the metal plug so as to overlap the gate. Similarly, as result of the different dielectric materials used during processing (see the detail discussion above with regard to the methods), each gate contact 295 will land on a gate and the upper solid segment 278 of the dielectric spacer 276 along with the plug caps 249 will prevent shorting of the gate contact 295 to an adjacent metal plug 248, even in the event that the gate contact opening used for that gate contact was patterned to be wider than the gate and/or offset so as to overlap an adjacent metal plug. So, as illustrated, the gate contact 295 can have a narrow portion, which is laterally surrounded by the upper solid segment 278 of the dielectric spacer 276, and a wider portion, which is above the narrow portion, which extends laterally over the upper solid segment 278 of the dielectric spacer 276 (e.g., onto the plug caps 249) without shorting to the metal plug 248 below. Thus, the gate contact 295 can, optionally, land over an active region of the FET (e.g., directly above the channel region 211 as shown in FIG. 22) or close thereto to minimize device size without risk of shorting to an adjacent metal plug.

In the methods and structures described above, the transistors 201, 202 can be N-type or P-type field effect transistors. For an N-type FET, the first type conductivity of the channel region(s) can be a P-type conductivity and the second type conductivity of the source/drain regions can be an N-type conductivity; whereas, for a P-type FET, the first type conductivity of the channel region(s) can be an N-type conductivity and the second type conductivity of the source/drain regions can be a P-type conductivity. Those skilled in the art will recognize that different dopants can be used to achieve the different conductivity types and that the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (Mg), whereas a gallium nitride (GaN)-based semiconductor material having an N-type conductivity is typically doped with silicon (Si). Those skilled in the art will also recognize that different conductivity levels will depend upon the relative concentration levels of the dopants.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed methods and structures and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations of elements as they are oriented and illustrated in the drawings (unless otherwise indicated). For example, a lower level or lower portion of an element will be positioned closer to the essentially planar bottom surface of the substrate than a higher level or higher portion of the same element; a horizontal surface will be essentially parallel to the planar bottom surface of the substrate and a vertical surface will be essentially perpendicular to the planar bottom surface of the substrate, etc. As used herein, terms such as "touching", "in direct contact with", "abutting", "directly adjacent to", "immediately adjacent to", etc., are intended to indicate that at least one element physically contacts another element (without other elements separating the described elements). Additionally, as used herein, the phrases "positioned laterally adjacent to" and "positioned laterally immediately adjacent to" refer to one element being positioned to the side of another element (i.e., situated at a side of another element) as opposed to being positioned above or below that other element as those elements are oriented and illustrated in the drawings. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit structure comprising:
    a gate adjacent to a semiconductor body at a channel region, the channel region being positioned laterally between source/drain regions;
    a gate contact above and immediately adjacent to the gate;
    metal plugs on the source/drain regions;
    plug caps above and immediately adjacent to the metal plugs; and
    a dielectric spacer comprising:
        a lower air-gap segment positioned laterally between the gate and the metal plugs; and
        an upper solid segment positioned laterally between the gate contact and the plug caps, wherein the lower air-gap segment is wider than a top portion of the upper solid segment.

2. The integrated circuit structure of claim 1, the upper solid segment and the lower air-gap segment comprising a dielectric material, wherein the lower air-gap segment further comprises a void within the dielectric material.

3. The integrated circuit structure of claim 1, the dielectric spacer further comprising an additional segment between the semiconductor body and the lower air-gap segment, wherein the additional segment and the upper solid segment comprise two different dielectric materials.

4. The integrated circuit structure of claim 3, the plug caps, the upper solid segment of the dielectric spacer and the additional segment of the dielectric spacer comprising three different dielectric materials, respectively.

5. The integrated circuit structure of claim 3, the upper solid segment of the dielectric spacer comprising silicon oxycarbide, the additional segment of the dielectric spacer comprising silicon nitride and the plug caps comprising silicon oxide.

6. The integrated circuit structure of claim 1, the gate contact further comprising a narrow portion laterally surrounded by the upper solid segment of the dielectric spacer and a wider portion above the narrow portion, the wider portion extending laterally over the upper solid segment.

7. The integrated circuit structure of claim 1, the gate having a first portion above and immediately adjacent to a top surface of the semiconductor body at the channel region and second portions on an isolation layer and positioned laterally adjacent to opposing sides of the semiconductor body, wherein the gate comprises a replacement metal gate and the gate contact is above and immediately adjacent to the first portion of the gate.

8. An integrated circuit structure comprising:
    a gate adjacent to a semiconductor body at a channel region, the channel region being positioned laterally between source/drain regions;
    a gate contact above and immediately adjacent to the gate;
    metal plugs on the source/drain regions;
    plug caps above and immediately adjacent to the metal plugs; and a dielectric spacer comprising:
   a lower air-gap segment positioned laterally between the gate and the metal plugs and comprising a lower portion of a conformal dielectric layer between the gate and the metal plugs and an air-gap within the lower portion of the conformal dielectric layer below a level of a top of the gate; and
   an upper solid segment above the lower air-gap segment, positioned laterally between the gate contact and the plug caps, and comprising an upper portion of the conformal dielectric layer, wherein the upper portion is solid and wherein the gate contact further comprises a narrow portion laterally surrounded by the upper solid segment of the dielectric spacer and a wider portion above the narrow portion, the wider portion extending laterally over the upper solid segment.

9. The integrated circuit structure of claim 8, wherein the upper solid segment prevents conductive material from the gate contact from entering the air-gap and creating a short between the gate contact and any of the metal plugs.

10. The integrated circuit structure of claim 8, the dielectric spacer further comprising an additional segment between the semiconductor body and the lower air-gap segment, wherein the additional segment and the upper solid segment comprise two different dielectric materials.

11. The integrated circuit structure of claim 10, the plug caps, the conformal dielectric layer, and the additional segment of the dielectric spacer comprising three different dielectric materials, respectively.

12. The integrated circuit structure of claim 10, the conformal dielectric layer comprising silicon oxycarbide, the additional segment of the dielectric spacer comprising silicon nitride and the plug caps comprising silicon oxide.

13. The integrated circuit structure of claim 8, the gate having a first portion above and immediately adjacent to a top surface of the semiconductor body at the channel region and second portions on an isolation layer and positioned laterally adjacent to opposing sides of the semiconductor body, wherein the gate comprises a replacement metal gate and the gate contact is above and immediately adjacent to the first portion of the gate.

14. An integrated circuit structure comprising:
a gate adjacent to a semiconductor fin at a channel region, the channel region being positioned laterally between source/drain regions;
a gate contact above and immediately adjacent to the gate;
metal plugs on the source/drain regions;
plug caps above and immediately adjacent to the metal plugs; and
a dielectric spacer comprising:
   a lower air-gap segment above the semiconductor fin and positioned laterally between the gate and the metal plugs, the lower air-gap segment comprising a lower portion of a conformal dielectric layer between the gate and the metal plugs and an air-gap within the lower portion of the conformal dielectric layer below a level of a top of the gate; and
   an upper solid segment above the lower air-gap segment, positioned laterally between the gate contact and the plug caps, and comprising an upper portion of the conformal dielectric layer, wherein the upper portion is solid and wherein the gate contact further comprises a narrow portion laterally surrounded by the upper solid segment of the dielectric spacer and a wider portion above the narrow portion, the wider portion extending laterally over the upper solid segment.

15. The integrated circuit structure of claim 14, wherein the upper solid segment prevents conductive material from the gate contact from entering the air-gap and creating a short between the gate contact and any of the metal plugs.

16. The integrated circuit structure of claim 14, the dielectric spacer further comprising an additional segment between the semiconductor fin and the lower air-gap segment, wherein the additional segment and the upper solid segment comprise two different dielectric materials.

17. The integrated circuit structure of claim 16, the plug caps, the conformal dielectric layer, and the additional segment of the dielectric spacer comprising three different dielectric materials, respectively.

18. The integrated circuit structure of claim 16, the conformal dielectric layer comprising silicon oxycarbide, the additional segment of the dielectric spacer comprising silicon nitride and the plug caps comprising silicon oxide.

* * * * *